United States Patent [19]

Minuhin

[11] Patent Number: 5,650,954
[45] Date of Patent: Jul. 22, 1997

[54] FREQUENCY AND TIME DOMAIN ADAPTIVE FILTRATION IN A SAMPLED COMMUNICATION CHANNEL

[75] Inventor: Vadim Boris Minuhin, Oklahoma City, Okla.

[73] Assignee: Seagate Technology, Inc., Scotts Valley, Calif.

[21] Appl. No.: 593,824

[22] Filed: Jan. 30, 1996

[51] Int. Cl.[6] .................................................. G06G 7/02
[52] U.S. Cl. ........................................................ 364/825
[58] Field of Search .................................. 364/825, 602, 364/724.18, 724.01, 724.19, 724.2

[56] References Cited

U.S. PATENT DOCUMENTS

| | | |
|---|---|---|
| 4,146,840 | 3/1979 | McRae et al. . |
| 4,346,412 | 8/1982 | Conley . |
| 5,060,088 | 10/1991 | Dolivo et al. . |
| 5,153,875 | 10/1992 | Takatori . |
| 5,189,637 | 2/1993 | Eriksson .................... 364/825 |
| 5,258,933 | 11/1993 | Johnson et al. ............ 364/602 |
| 5,325,130 | 6/1994 | Miller et al. . |
| 5,392,171 | 2/1995 | Kovner et al. . |
| 5,422,760 | 6/1995 | Abbott . |
| 5,430,768 | 7/1995 | Minuhin et al. . |
| 5,459,757 | 10/1995 | Minuhin et al. . |
| 5,563,819 | 10/1996 | Nelson .................... 364/825 |

OTHER PUBLICATIONS

R.D. Gitlin et al., "*Data Communications Principles*", Plenum Press, New York, 1992, pp. 488–508.

A. Gersho, "*Adaptive Equalization of Highly Dispersive Channels for Data Transmission*", The Bell System Technical Journal, Jan. 1969, pp. 55–70.

D.S. Humpherys, "*Equiripple Network Approximations Using Iteration Techniques*", Proceedings of National Electronics Conference, vol. 20, 1964, pp. 753–758.

R.L. Geiger et al., "*Active Filter Design Using Operational Transconductance Amplifiers: A Tutorial*", IEEE Circuit and Devices, vol. 1, No. 2, Mar. 1995, pp. 20–32.

F.J. MacWilliams et al., "*Pseudo–Random Sequences and Arrays*", IEEC Proceedings, vol. 64, No. 12, Dec. 1976, pp. 1715–1729.

K. Han et al., "*Comparison of Different Detection Techniques for Digital Magnetic Recording Channels*", IEEE Transactions on Magnetics, vol. 31, No. 2, Mar. 1995, pp. 1128–1133.

(List continued on next page.)

*Primary Examiner*—Tan V. Mai
*Attorney, Agent, or Firm*—Bill D. McCarthy; Edward P. Heller, III; Randall K. McCarthy

[57] ABSTRACT

Apparatus for performing time and frequency-domain filtering in a sampled communication channel for the transmission of binary information. A received signal is provided to a double-domain, analog transversal equalizer comprising a plurality of serially connected, active, analog filter sections with associated tap locations, each filter section having a programmable frequency response and adaptively controlled one-bit delay. The filter sections provide sequential, cumulative frequency domain filtering as the received signal propagates through the equalizer. The transfer function of each filter section has a linear phase polynomial denominator and a real (at $s=j\omega$) polynomial numerator, facilitating independent control of the delay and frequency response of each filter section. A plurality of analog multipliers multiply signals present at the tap locations by analog tap weight signals to generate a plurality of product signals, and an analog summer adds the product signals to generate an output filtered signal before sampling occurs. An LMS error-based adaptive tap weight control circuit iteratively generates optimal analog tap weight signals, a delay control circuit provides the necessary timing signals at the bit-rate to control the time delay of each analog filter section and a location of zeros circuit controls the location of zeros in the transfer function, and hence the frequency response, of each filter section. The double-domain transversal equalizer provides aperiodic and controlled frequency response at low frequencies and does not require a noise suppressing prefilter.

23 Claims, 13 Drawing Sheets

OTHER PUBLICATIONS

R.D. Cideciyan et al., "*A PRML System for Digital Magnetic Recording*", IEEE Journal on Selected Areas of Communications, vol. 10, No. 1, Jan. 1992, pp. 38–56.

E. Healey, "*Choosing the right PRML read channel*", Data Storage, Nov./Dec. 1995, pp. 27–34.

J.D. Coker et al., "*Implementation of PRML in a Rigid Disk Drive*", IEEE Transactions on Magnetics, vol. 27, No. 6, Nov. 1991, pp. 4538–4543.

P. Kabal et al., "*Partial–Response Signaling*", IEEE Transactions on Communications, vol. com–23, No. 9, Sep. 1975, pp. 921–934.

G. Kerwin et al., "*Performance Evaluation of the Disk Drive Industry's Second Generation PRML Data Channel*", IBM Technical Paper, FD–1 (No Date).

K.C. Bracken et al., "*Adaptive Continuous–Time Equalization and FDTS/DF Sequence Detection*", I.E.E.E. Transactions on Magnetics, vol. 31, No. 6, Nov. 1995, pp. 3048–3050.

H. K. Thapar et al., "*A Claim of Partial Response Systems for Increasing Storage Density in Magnetic Recording*", IEEE Transactions on Magnetics, vol. Mag–23, No. 5, Sep. 1987, pp. 3666–3668.

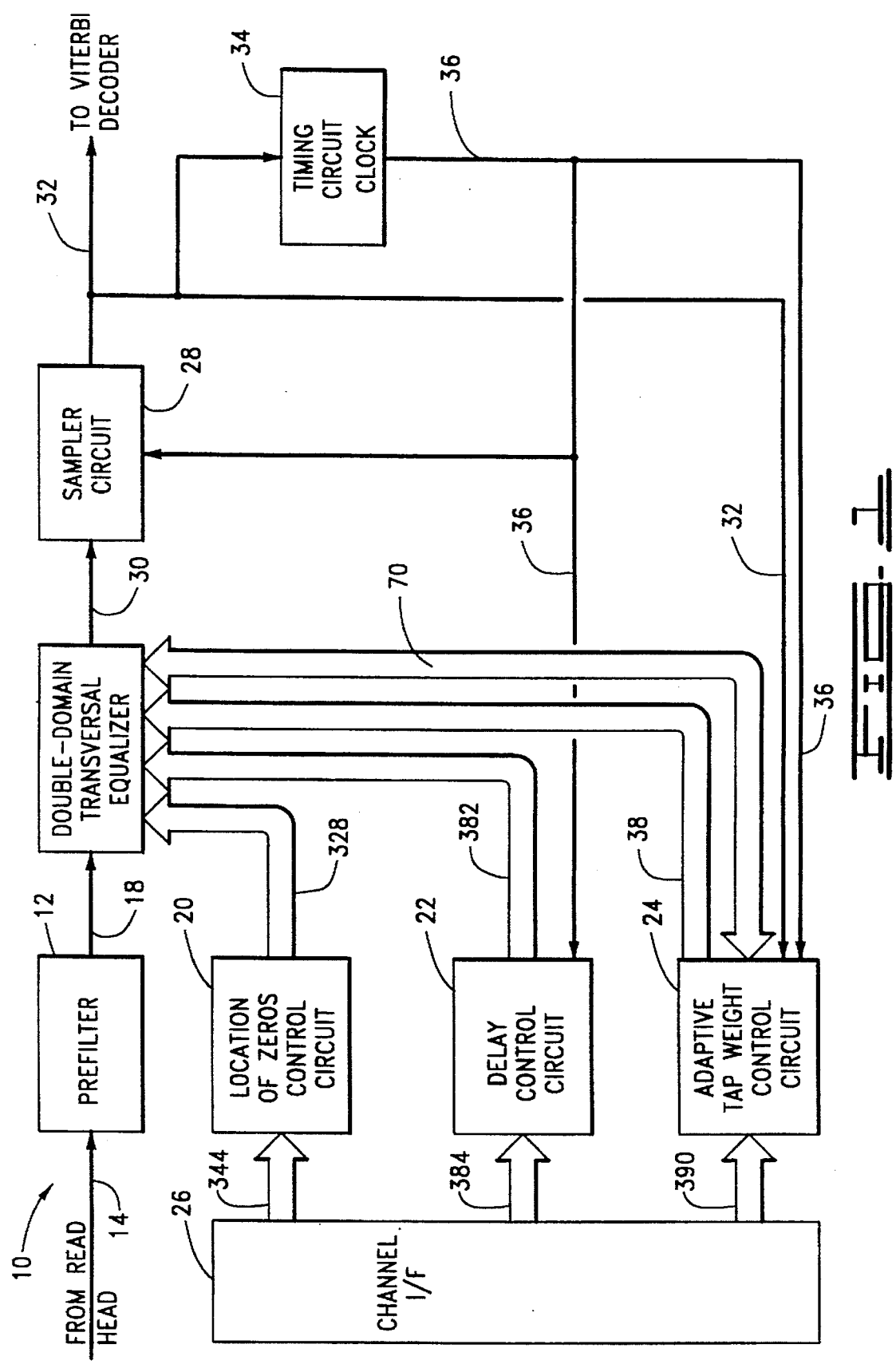

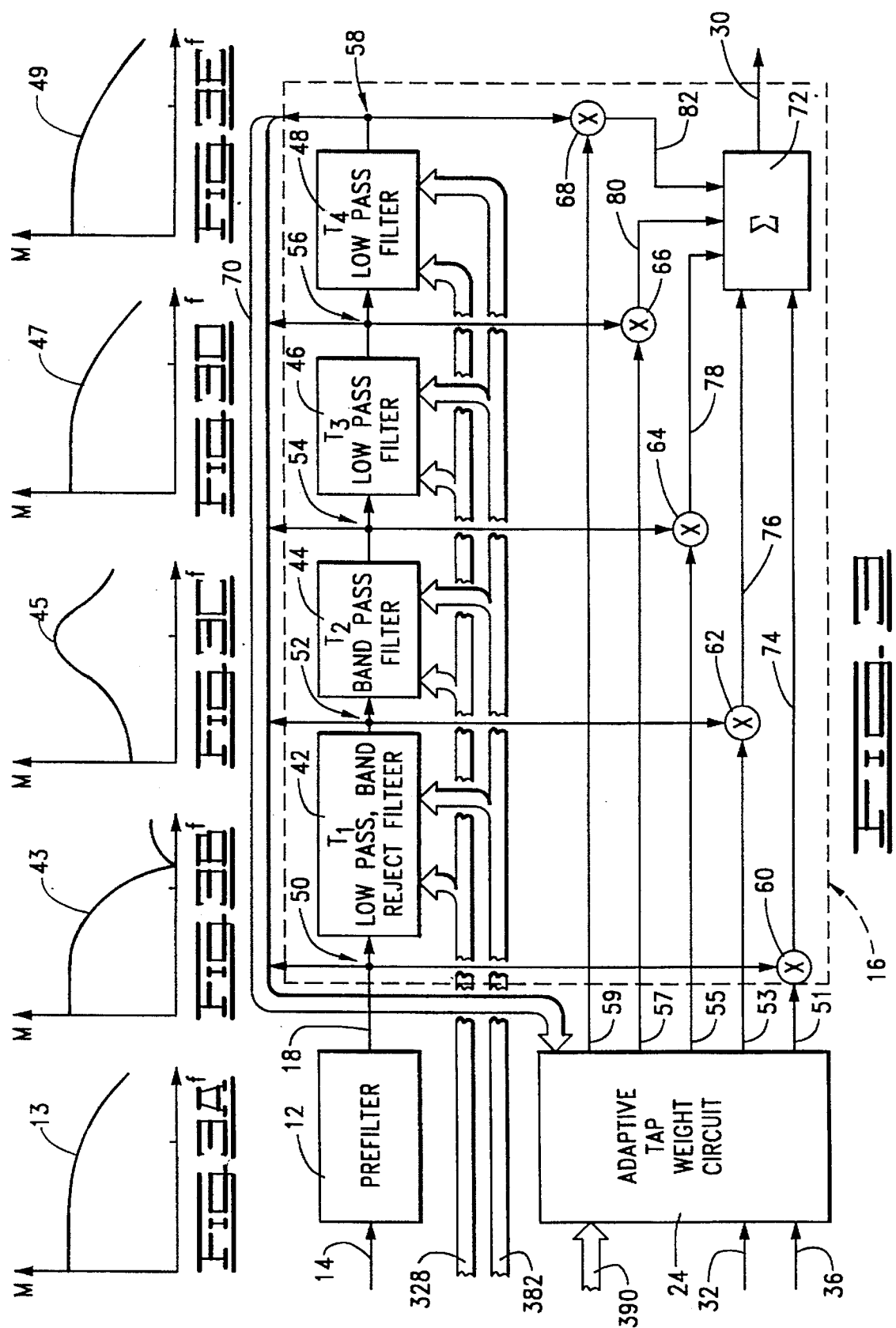

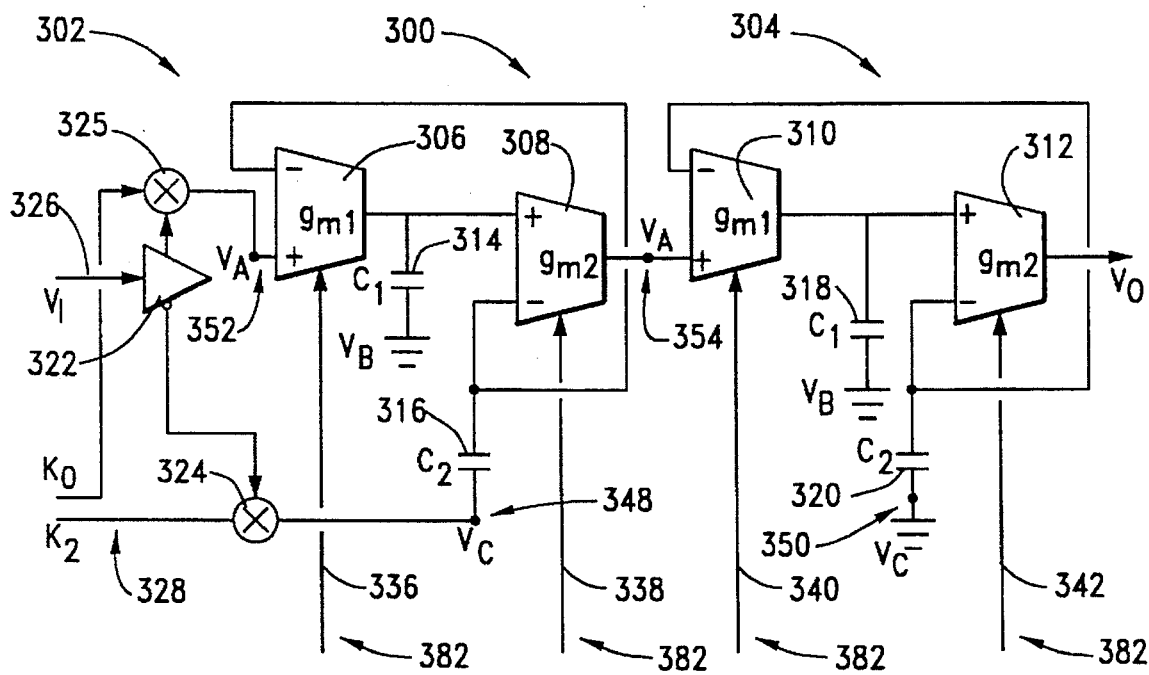

FIG. 10

| MODE | VOLTAGES | TRANSFER FUNCTION | $\omega_o$ ($g_{M1}=g_{M2}=g_M$) | Q |
|---|---|---|---|---|
| NONE (LOW PASS) | $V_A=V_I$ $V_B=GND$ $V_C=GND$ | $\dfrac{g_{M1}g_{M2}}{s^2C_1C_2+sC_1g_{M2}+g_{M1}g_{M2}}$ | $\dfrac{g_M}{\sqrt{C_1C_2}}$ | $\sqrt{\dfrac{C_2}{C_1}}$ |
| BOOST (BAND PASS) | $V_A=V_I$ $V_B=GND$ $V_C=-V_I$ | $\dfrac{-s^2C_1C_2+g_{M1}g_{M2}}{s^2C_1C_2+sC_1g_{M2}+g_{M1}g_{M2}}$ $(K_0=1, K_2=-1)$ | $\dfrac{g_M}{\sqrt{C_1C_2}}$ | $\sqrt{\dfrac{C_2}{C_1}}$ |
| NOTCH | $V_A=V_I$ $V_B=GND$ $V_C=V_I$ | $\dfrac{s^2C_1C_2+g_{M1}g_{M2}}{s^2C_1C_2+sC_1g_{M2}+g_{M1}g_{M2}}$ $(K_0=1, K_2=1)$ | $\dfrac{g_M}{\sqrt{C_1C_2}}$ | $\sqrt{\dfrac{C_2}{C_1}}$ |

FIG. 11

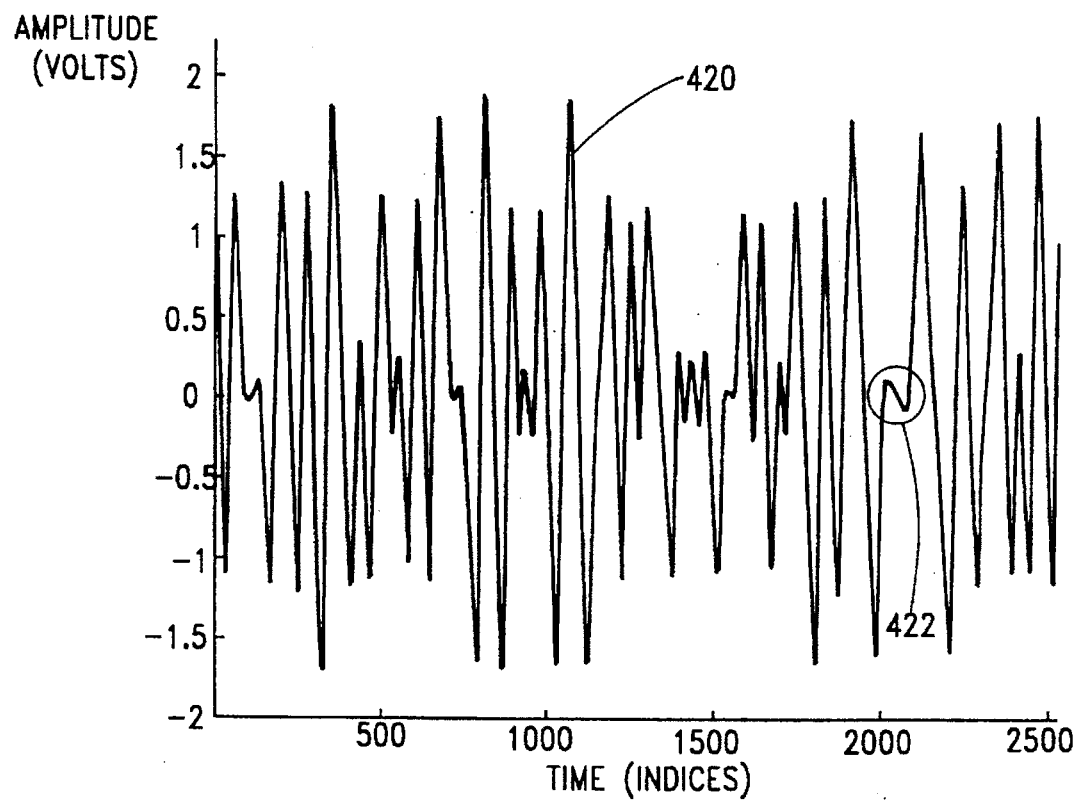
FIG. 16
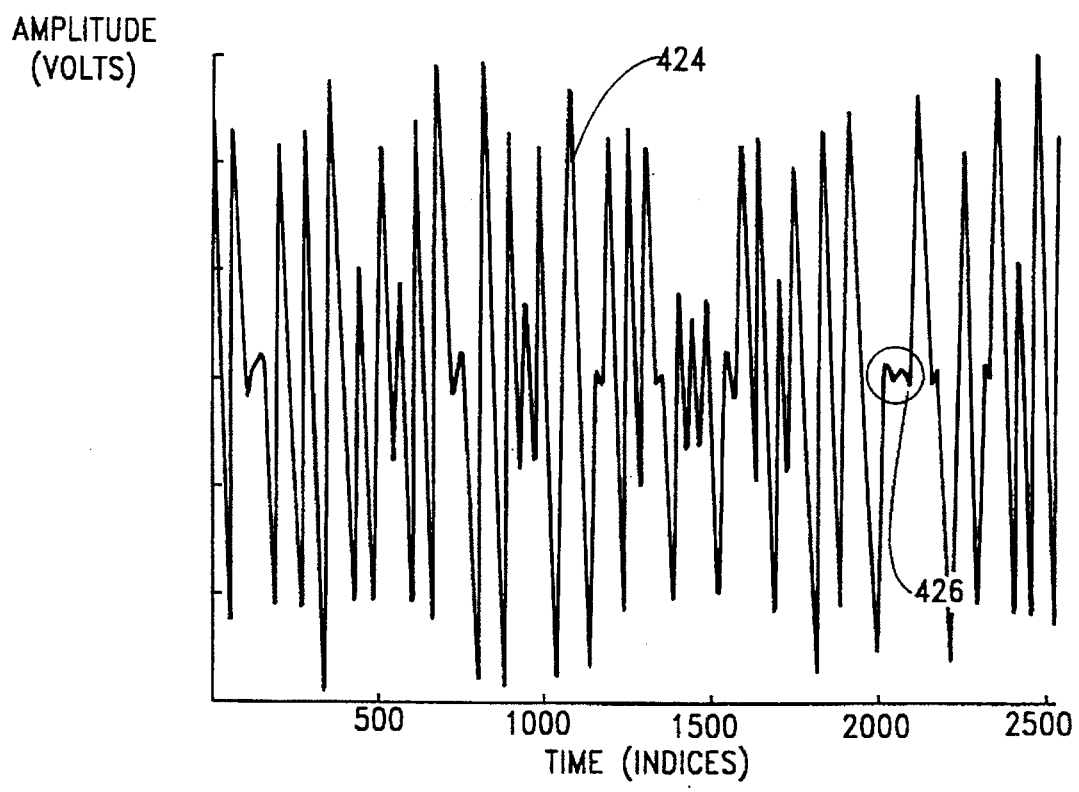
FIG. 17

FREQUENCY AND TIME DOMAIN ADAPTIVE FILTRATION IN A SAMPLED COMMUNICATION CHANNEL

BACKGROUND OF THE INVENTION

1. Field of the Invention

The present invention relates generally to improvements in electronic filters, and more particularly, but not by way of limitation, to improvements in electronic filters suitable for use in sampled communication channels such as in a disc drive read channel.

2. Discussion

Historically, the term "filter" has generally referred to a device designed to exhibit a specified magnitude response to an input signal. Recent developments in sampled, pulse-based communication systems, however, have led to the realization that time-domain characteristics of a filter are as important a design consideration as the frequency-domain characteristics of the filter. Conventional frequency-domain analysis, though, is still predominant in the construction and operation of a filtering system, as the ability of a filter to reject random noise is best described in the frequency domain.

The importance of a filter's time-domain characteristics can be exemplified by what is commonly referred to as a "matched filter", which will be recognized as a filter having an optimized output signal-to-noise ratio when the input response of the filter is the mirror image of the received pulse. A matched filter is a true filter in every sense of the word, but the foregoing definition emphasizes the filter's time-domain characteristics and not its frequency response. Such a matched filter is "signal selective", rather than "frequency selective"; that is, a matched filter makes no attempt to preserve the shape of an input signal at the output of the filter, but rather attempts to optimize the detection of the input signal.

The time-domain characteristics of filters are a primary concern in the transmission of data through modern communications networks. Particularly, it will be recognized by those skilled in communication theory that an optimal linear filter for the binary transmission of information through a communication channel subject to dispersion and intersymbol interference (ISI) and immersed in white Gaussian noise (WGN) comprises a matched filter in series with a tapped delay line (the matched filter is matched to the received pulse, not the transmitted pulse). See, for example, the text R. D. Gitlin et al. entitled "DATA COMMUNICATION PRINCIPLES", Plenum Press, New York, 1992, pp. 491–508, incorporated herein by reference. In other words, the output of the optimal linear receiving filter is a weighted sum of the output of the matched filter which is delayed by different amounts of time nT (with n being an integer and T being a bit, or sampling period). The output of the linear receiving filter is then sampled at the bit rate T and this provides the best estimate of the transmitted bit stream.

The structure which produces a weighted sum of time-delayed versions of an input signal is known as a "transversal filter" or "transversal equalizer". It will be recognized that the optimum values for the tap weights can be determined adaptively by the transversal equalizer itself, and, once so optimized, the transversal equalizer operates as a time-domain filter to minimize the effects of ISI in the transmitted data stream. For more discussion, see A. Gersho, "ADAPTIVE EQUALIZATION OF HIGHLY DISPERSIVE CHANNELS FOR DATA TRANSMISSION", Bell System Technical Journal, January 1969, pp. 55–69, incorporated herein by reference.

In the past, it has not been generally feasible to realize an optimal analog transversal equalizer in a communication channel, due to a variety of real world constraints. First, an optimal analog transversal equalizer has an infinite number of taps, requiring infinite length. Additionally, as the electric signals propagate with the speed of light, manufacturable analog delay lines comprising lumped elements have not been able to emulate good delays with reasonable accuracy while meeting both economic and volume constraints. Moreover, transversal equalizers in communication channels generally require receipt of data at different transfer rates, providing an additional requirement that the delay characteristics of optimal transversal equalizers must be both variable and tightly controlled.

As a result of such real world constraints, the communications industry has implemented digital electronics in the construction of the equalizer as a substitute for the optimal analog transversal equalizer. In the construction of such a digital substitute device, as the equalizer tap spacing is the same as the bit rate (1/T), the output sampler from an optimal analog equalizer can be moved to the input of the digital transversal equalizer. Thus, the resulting digital arrangement typically includes an analog to digital converter (ADC) connected to the output of the sampler and clocked at the bit rate, along with a digital transversal equalizer comprising clocked shift registers as delay elements connected to the ADC. More particularly, the analog input signal is subjected to preliminary frequency-domain filtering (to reduce noise), and then sampled and converted to digital form by the ADC. The output of the ADC is provided to the digital transversal equalizer wherein digital signal processing takes place through the addition of successive sample values from cells of the shift register, weighted appropriately by digital multipliers to provide samples of the equalized signal. These samples are then used for data recovery and for self-synchronization. Such digital transversal equalizers are well known in the prior art and are also referred as "synchronous equalizers" (see the previously incorporated Gitlin et al. reference, p. 492). For additional discussion concerning digital equalization, see U.S. Pat. No. 4,146,840 entitled TECHNIQUE FOR OBTAINING SYMBOL TIMING FOR EQUALIZER WEIGHTS issued Mar. 27, 1979 to McRae et al.

Thus, the digital substitute for the optimum linear receiver actually comprises two different receiving filters connected in series: (1) a non-adaptive analog frequency-domain matched filter that facilitates an optimal signal/noise ratio at its output, and (2) a self-adaptive digital time-domain synchronous transversal equalizer that facilitates descrambling of ISI (through the self-adaptation of tap weight values).

The use of synchronous transversal equalizers in the time-domain filtering of input signals, however, requires that all frequency-domain filtering must be completed before sampling takes place in order to minimize the occurrence of aliasing of noise and unwanted signal components. As described in more detail in the previously incorporated Gitlin reference, such synchronous transversal equalizers do not have a controllable frequency response.

It will be recognized that specialists in communication systems have not been satisfied with the performance of this substitute digital synchronous equalizer, and in response have recently developed what is referred to as a "fractionally spaced equalizer" (FSE). The FSE filter operates in a similar fashion as the synchronous equalizer, but is much more complex. Generally, the initial sampling in an FSE filter is performed at two or three times the bit rate and the number of delay elements and taps in an FSE filter is correspondingly two or three times that of a synchronous equalizer. Additionally, the tap-weight adaptation circuitry also operates at two or three times the bit rate. The FSE filter also includes a relatively sophisticated digital "decimation" circuit, which reprocesses oversampled values and provides the output of the FSE filter which is finally sampled at the bit rate. The FSE filter overcomes many of the disadvantages of the digital substitute (at the expense of more complex circuitry) and, within bit-rate limits, can closely approximate the performance of the optimum analog transversal equalizer. As a result of the superior performance of the FSE filter, the telephone industry (which operates with signals in the KHz range) is now in the process of replacing synchronous equalizers with FSE filters. (For more discussion of the FSE filter, see the previously incorporated Gitlin et al. reference at pp. 495–500.)

However, as desirable the FSE filter may be for applications such as telephone communication systems, the increasingly higher transfer rates required in the disc drive industry (which presently operate with signals in the hundreds of MHz range), as well as the associated power and space constraints, provide limitations on the effectiveness of both the synchronous equalizer and the FSE filter in disc drive applications. The phenomenal growth in personal computers in the past decade led to unprecedented progress in all aspects of associated technology, including advancements in disc drive magnetic storage. At the present, recording (areal) densities in modern disc drives are approaching 1 Gbit/square inch, with drastically decreasing energy allocations per stored bit. At the same time, data transfer rates of greater than 200 Mbits/second have been achieved, and increasingly higher data transfer rates will continue to be demanded in the future.

Additionally, as disc drive form factors continue to decrease, it becomes increasingly necessary to integrate the disc drive functions into large scale integration (LSI) devices having small chip sizes and power consumption levels, capable of functioning with lower signal/noise ratios (as transfer rates increase) while maintaining or improving bit error rate levels (which are typically on the order of $10^{-12}$). The industry is also transitioning from peak detection to Partial Response, Maximum Likelihood (PRML) read channels in disc drives. The term "partial response" indicates that the response of a single bit transferred binary information is spread out to adjacent bit intervals; that is, only part of the bit response is inside of the corresponding nominal bit interval. In disc drives of this type, partial response signaling is utilized to control, rather than to suppress, intersymbol interference (ISI) and the effect of noise is minimized by the use of maximum likelihood detection of the magnetization of sequences of segments of the data track. To this end, signals corresponding to individual flux transitions are filtered to a signal which, in the absence of noise, would have a nominal form and the signals are then sampled at times determined in relation to this nominal form for maximum likelihood detection in which each bit of encoded data is recovered in the context of the sequence of bits that were written to the disc to limit the effect of noise.

PRML signal processing places stringent requirements on filtering of the signals induced in the read head prior to maximum likelihood detection. To achieve satisfactory results, the filtering must be performed in both the frequency-domain (to minimize the effects of noise) and in the time-domain (to obtain a particular waveform with known and controlled ISI, which can subsequently be descrambled in a maximum likelihood detector). While maximum likelihood detection limits the effect of noise and ISI, the variances between the nominal, ideal form to which the signal induced in the read head is to be filtered and the actually realized filtered signal constitute systematic noise which can generate errors in data recovery.

Another complicating factor in disc drive read channels is that, given constant rotational speed of the disc and relatively uniform areal recording density with respect to disc radius, the transfer rate of data from a data track at the outermost radius of the disc is generally about three times the transfer rate for a data track at the innermost radius. This requires a corresponding frequency scaling of the filtering system with respect to disc radius. Additionally, the form of the signal induced in a magnetic head (or AC sense circuitry used with magneto-resistive heads) varies not only from drive to drive, but also among heads within each drive. For economic reasons, obtaining sufficient yields in manufacturing of inexpensive disc drives necessitates the allowance of relatively loose tolerances in the variations of head-media components and the ability of the channel electronics to compensate for the effects of these variations. Thus, the filter in a disc drive must not only be capable of filtering the input signal to a reasonable approximation of a specific waveform, but must be able to do so adaptively, and at a low cost.

As provided hereinabove, prior art attempts to implement circuits for performing filtering in PRML channels in disc drives involved the use of preliminary frequency-domain filtering in combination with a synchronous digital transversal equalizer. In addition to the aforementioned problems associated with the inability of the synchronous equalizer to perform frequency-domain filtering, the use of such synchronous equalizers in the specific area of disc drives also have provided additional limitations. First, the digital signal processing and the inherent delay in the synchronous transversal equalizer requires at least several additional clock cycles, which introduces additional processing time in the timing circuitry (phased locked loop, or PLL) that provides the sampling clock for the ADC. As a result, time correction is delayed with respect to the times at which samples are taken. Such delay is usually termed "transportation lag" or "dead time" in control theory; see, for example, K. Ogata, "MODERN CONTROL ENGINEERING", Prentice-Hall, Englewood Cliff, 1970, pp. 346–350. This dead time adversely affects the stability of the PLL. Additionally, as transfer rates continue to increase, the digital signal processing must occur at very high speeds, requiring increasingly more complex circuitry with larger (silicon die) areal and power consumption requirements. These limitations provide an upper limit to the feasibility of the use of synchronous equalizers in disc drive PRML read channels.

The disadvantages of digital synchronous equalizers have led to attempts to replace the digital time-domain filtering with analog time-domain elements through the use of analog transversal equalizers. However, these attempts have been largely unsuccessful, primarily due to the constraints that led the industry to use digital electronics in the first place as a substitute for the optimum analog transversal equalizer. The problems associated with such prior art attempts to use analog transversal equalizers is illustrated by U.S. Pat. No. 5,325,130 entitled GHOST CANCELER, issued Jun. 28, 1994 to R. Miller, which describes a programmable analog transversal equalizer for a High Definition Digital Television (HDDT) application. Because of the absence of adequate electronic delay elements, the equalizer of Miller employs the use of an "exotic" electro-acoustic delay device in order to achieve reasonable delay performance. While such an approach may be feasible in an HDDT application, such an approach is not feasible in a disc drive read channel due to both size and cost constraints.

SUMMARY OF THE INVENTION

Accordingly, the present invention provides an apparatus for performing time and frequency-domain filtering in a communication channel. An input signal is provided to a double-domain, analog transversal equalizer comprising a plurality of serially connected analog filter sections having associated tap locations, each analog filter section comprising a programmable frequency domain filter for providing sequential frequency domain filtering and one-bit time delay per section in accordance with a controllable transfer function.

A plurality of analog multipliers multiply signals present at the tap locations by analog tap weight signals to generate a plurality of product signals, and an analog summer adds the product signals to generate an output filtered signal. An adaptive tap weight circuit iteratively generates the analog tap weight signals, a delay control circuit provides the necessary signals to control the time delay of each analog filter section, and a frequency control circuit provides parameters that independently control the frequency response of each filter section. The frequency response of each filter section is thus controlled independently of the time delay of each section.

An object of the present invention is to perform adaptive frequency and time-domain filtration of an input signal in a high transfer rate communication channel.

Another object of the present invention is to provide a filtering system that can be adapted to substantially any type of communication channel with which the filtering system might be used.

Yet a further object of the present invention is to provide a filtering system for a communication channel that is relatively simple and economical to manufacture.

Other objects, features and advantages of the present invention will become apparent from the following detailed description when read in conjunction with the drawings and appended claims.

BRIEF DESCRIPTION OF THE DRAWINGS

FIG. 1 is a general functional block diagram of a filtering system constructed in accordance with the present invention for the case of PR-4 magnetic recording channel employing maximum likelihood detection.

FIG. 3a is a graphical representation of the frequency magnitude response of the prefilter of FIG. 1. FIGS. 3b–3e are graphical representations of the frequency magnitude responses of the delay sections of the transversal equalizer of FIG. 3.

FIG. 9 provides a schematic block diagram of a prior art second-order integral filter employing the use of transconductors and integral capacitors.

FIG. 10 is a schematic block diagram for the preferred embodiment of the structure for each of the delay sections of the transversal equalizer of FIG. 3.

FIG. 11 is a table listing the mode, voltages and corresponding transfer functions of the second-order filter stages shown in FIG. 10.

FIG. 16 is a graphical representation of the time-domain signal at the main tap location of the transversal equalizer of FIG. 3 in response to the input read signal of FIG. 13.

FIG. 17 is a graphical representation of the equalized time-domain signal at the output of the transversal equalizer of FIG. 3 in response to the read signal of FIG. 13.

DETAILED DESCRIPTION OF THE PREFERRED EMBODIMENT

Figure 2A:
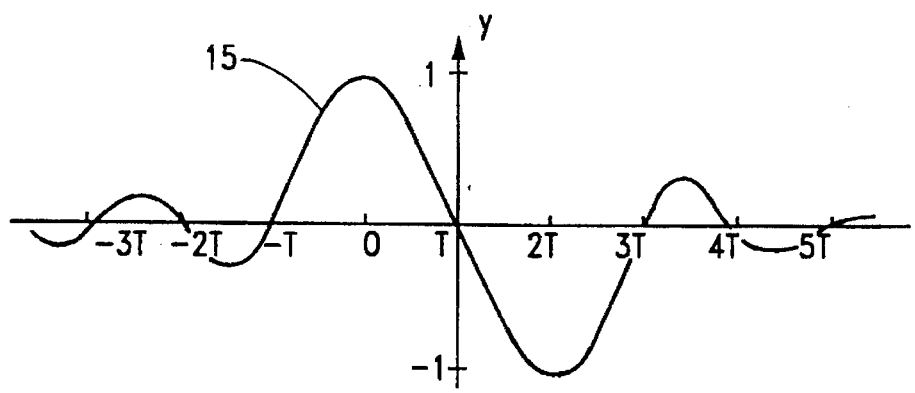
FIG. 2a is a graphical representation of an ideal time response of a PR-4 channel to a unit pulse of recorded media magnetization.

The filtering system of the present invention can be implemented in a variety of communication channel applications, but for purposes of disclosure the present invention will be described as embodied in a partial response type 4 (PR-4) magnetic recording channel in a disc drive. At the present, this particular channel is the most popular "advanced" (based on sequence detection) in the magnetic storage industry, and it embodies a reasonable compromise between other, theoretically more powerful advanced channels and associated difficulties in their practical implementations.

The PR-4 channel is also best known and provides a vehicle through which the important and intricate relations between filtering in both frequency and time domains can be illustrated. At the conclusion of the description, additional applications for the present invention will be presented. Additional discussion regarding the use of the PR-4 channel in disc drive applications is provided in U.S. patent application Ser. No. 08/309,912 entitled DISC DRIVE PRML CHANNEL WITH ADAPTIVE ANALOG TRANSVERSAL EQUALIZER, filed Sep. 21, 1994 by Vadim B. Minuhin, Vladimir Kovner and Srinivasan Surendran, and U.S. patent application Ser. No. 08/536,008 entitled TIME DOMAIN FILTER FOR A COMMUNICATION CHANNEL, filed Sep. 29, 1995 by Vadim B. Minuhin, Vladimir Kovner and Srinivasan Surendran. Both of these references are assigned to the assignee of the present invention and are incorporated herein by reference.

Referring now to the drawings, and FIG. 1 in particular, shown therein is a general functional block diagram of a filtering system (generally denoted as item 10), constructed in accordance with the present invention for the case of PR-4 magnetic recording channel employing maximum likelihood detection. As shown in FIG. 1, an input signal from a disc drive read head (not shown) is received by a prefilter 12 by way of signal path 14. The prefilter 12 performs preliminary frequency-domain filtering on the input signal and then transmits the filtered signal to a double-domain transversal equalizer 16 (hereinafter also referred to as "transversal equalizer 16"), by way of a signal path 18. As will be discussed in more detail below, the use of the descriptor "double-domain" refers to the operation of the transversal equalizer 16 in controllably filtering the signal input thereto in both the time and the frequency domains, in accordance with the present invention.

Also shown in FIG. 1 are several circuits having connections with the transversal equalizer 16, including a location of zeros control circuit 20, a delay control circuit 22 and an adaptive tap weight control circuit 24. The construction and operation of these circuits will be discussed in greater detail hereinbelow, but generally, the location of zeros control circuit 20 operates to control the frequency response of the transversal equalizer 16 by controlling the location of zeros within the transfer functions of filtering elements within the transversal equalizer 16. Additionally, the delay control circuit 22 operates to control the time delay of the delay sections of the transversal equalizer 16, and the adaptive tap weight control circuit 24 operates to adaptively provide optimum tap weights for the transversal equalizer 16 during operation. FIG. 1 also shows a channel interface 26, which passes various data and control signals to the circuit of FIG. 1 from disc drive control circuitry (not shown), which includes a conventional disc drive microprocessor (also not shown).

The output of the transversal equalizer 16 in FIG. 1 is shown to be provided to a conventional sampler circuit 28 by way of a signal path 30. The output of the sampler circuit 28 is provided by way of signal path 32 to a downstream maximum likelihood detector (or "Viterbi decoder", not shown in FIG. 1) as well as to a conventional timing circuit 34 and to the adaptive tap weight control circuit 24. The timing circuit 34 operates as a phase-locked loop to process the sampled values from the sampler circuit 28 and, in response thereto, provide clock signals on signal path 36 to the sampler circuit 28, the delay control circuit 22 and to the adaptive tap weight control circuit 24. For additional discussion concerning the construction and operation of a typical Viterbi decoder and the timing circuit 34, see U.S. Pat. No. 5,430,768 entitled IMPROVED MAXIMUM LIKELIHOOD DETECTOR FOR A DISC DRIVE PRML READ CHANNEL, issued Jul. 4, 1995 to Minuhin, Kovner, Holsinger and Dahandeh, and U.S. Pat. No. 5,459,757 entitled TIMING AND GAIN CONTROL CIRCUIT FOR A PRML READ CHANNEL, issued Oct. 17, 1995 to Minuhin, Kovner, Holsinger and Surendran. Both of these references are assigned to the assignee of the present invention and are incorporated herein by reference.

Before continuing with the discussion of the filtering system 10 of FIG. 1, however, it may be desirable to first provide a general overview of the ideal response of a PR-4 channel. Referring to FIG. 2a, shown therein is a graphical representation of an ideal time response of a PR-4 channel to a unit pulse of recorded media magnetization at moment t=0. More particularly, FIG. 2a shows a curve 15 plotted against a horizontal time axis ("t") and a vertical amplitude axis ("y"), the curve 15 generally described by the following equation:

$$y = \frac{\sin(k\pi t/T)}{(k\pi t/T)} - \frac{\sin[(k-2)\pi t/T]}{(k-2)\pi t/T} \tag{1}$$

where k represents sequentially incremented integer values and T represents the bit interval (that is, the bit-rate sampling of the PR-4 channel). As shown in FIG. 2a, the curve 15 has values of y=0 at times t=−3T, −2T, −T, +T, +3T, +4T and +5T, a value of y=+1 at time t=0 and a value of y=−1 at time t=2T.

Figure 2B:
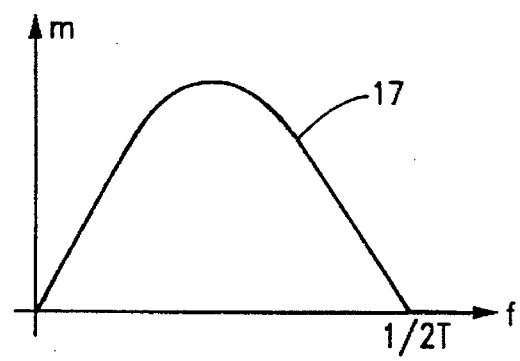
FIG. 2b is a graphical representation of the ideal frequency magnitude response of a PR-4 channel.

Correspondingly, FIG. 2b provides a graphical representation of the ideal frequency magnitude response of a PR-4 channel. More particularly, FIG. 2b shows a curve 17 plotted against a horizontal frequency axis ("f") and a vertical magnitude axis ("m"), the curve 17 generally described by equations (2):

$$m = \sin(2\pi Tf), \quad \text{for } 0 < f < \frac{1}{2T} \tag{2}$$

$$m = 0, \quad \text{for } f > \frac{1}{2T}$$

with T being the bit interval. It will be recognized that the curves 15, 17 shown in FIGS. 2a and 2b, respectively, are related to each other by the Fourier Transform.

As will be recognized, a PR-4 channel is also defined as a type 1−$D^2$ sampled channel, where D is the unit delay operator. In other words, the non-zero response to a single bit (of media magnetization) is only partially contained in the corresponding bit interval, and the response spreads two bit intervals later ($D^2$), creating an adjacent negative pulse (−$D^2$) With the zero value response therebetween. Thus, a PR-4 channel is a sampled channel with an intentionally designed and, therefore, nominally known amount of ISI. The task of the descrambling of ISI in the PR-4 channel is assigned to the Viterbi decoder (not shown).

It will be recognized that a PR-4 channel requires filtering to: 1) maintain control of ISI so that sampling of the resulting waveform shape approximates as much as possible the said known (−$D^2$ channel) waveform (which can be described as a time-domain function), and 2) reject random noise from the input signal (which can be described as a frequency-domain function). As will be discussed in more detail below, the filtering system 10 of the present invention facilitates the execution of these two tasks. Additionally, it will be noted that, in the context of the particular application as shown in FIG. 1, the target signal for "frequency-domain matching" is the frequency response of an ideal PR-4 channel as shown by curve 17 in FIG. 2b (and not the frequency response of the matched filter, as described hereinabove).

Continuing with the discussion of FIG. 1, the raw playback signal from the magnetic read head (not shown) is amplified in a head preamplifier (not shown) and supplied to the prefilter 12, as provided above, on path 14. The prefilter 12 is a conventional elementary (low order) linear-phase prefilter, and, unlike prior art transversal equalizers, is not necessary in the circuit; that is, the existence of the prefilter in the circuit will generally result in some preliminary noise suppression (frequency domain filtering) on the signal provided to the transversal equalizer 16, thereby facilitating improved signal processing at the input of the transversal equalizer 16. However, the prefilter 12 is optional and is not required in the practice of the present invention, as the transversal equalizer 16 provides the necessary frequency-domain filtration, as well as the time-domain filtration, required by the PR-4 channel.

Figure 3:
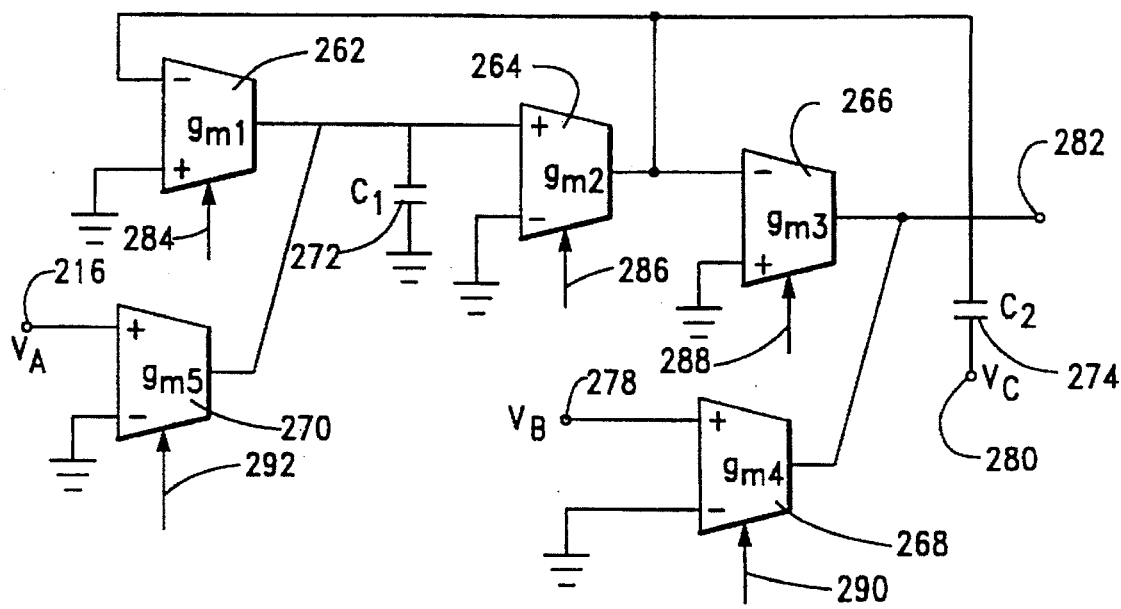
FIG. 3 is a graphical representation of the transversal equalizer of FIG. 1.

The input signal to the transversal equalizer 16 is provided on signal path 18, which encounters within the transversal equalizer 16 a chain of controllable active linear-phase filter sections, as shown in FIG. 3. More particularly, FIG. 3 shows the transversal equalizer 16 to comprise serially connected delay sections 42, 44, 46 and 48, labeled as $T_1$, $T_2$, $T_3$ and $T_4$, respectively. The construction and operation of the delay sections 42, 44, 46 and 48 will be discussed in greater detail below, but initially it will be noted that each of these delay sections provides a uniform delay of one bit interval in the frequency range of the useful signal. At the same time, it will be noted that the delay sections 42, 44, 46 and 48 provide different frequency responses (that is, provide different frequency-domain filtering of the input signals). These frequency responses are illustrated graphically by FIGS. 3b, 3c, 3d and 3e, respectively (for reference, FIG. 3a provides a graphical representation of the frequency response of the optional prefilter 12, which is included in FIG. 3).

More particularly, FIGS. 3a–3e provide graphical representations of the frequency magnitude response provided by the associated prefilter 12 and delay sections 42, 44, 46 and 48 with respect to frequency (as indicated therein by curves 13, 43, 45, 47 and 49, respectively). The tick marks on the horizontal axes in these figures generally indicate the upper boundary of the useful signal frequency range (and correspond to the frequency $f=1/(2T)$ in FIG. 2b). The significance of these particular responses, and how these responses are controlled, will be explained below.

Continuing with the circuit of FIG. 3, tap locations 50, 52, 54, 56 and 58 supply output signals (tap signals) from the prefilter 12 and the delay sections 42, 44, 46 and 48 to analog multipliers 60, 62, 64, 66 and 68 (which preferably are Gilbert cells). The multiplication coefficients (tap weights) of the multipliers 60, 62, 64, 66 and 68 are provided by the adaptive tap weight control circuit 24 by way of signal paths 51, 53, 55, 57 and 59 (shown collectively as bus 38 in FIG. 1), and in turn, the adaptive tap weight control circuit 24 receives the output signals (tap signals) from the tap locations 50, 52, 54, 56 and 58 by way of a bus generally denoted as 70.

The operation of the adaptive tap weight control circuit 24 in providing the tap weights to the multipliers 60, 62, 64, 66 and 68 will be discussed in more detail hereinbelow. However, it will be sufficient at this time to note that, in response to the input tap signals and tap weights, the multipliers 60, 62, 64, 66 and 68 provide product output signals to an analog summer 72 by way of signal paths 74, 76, 78, 80 and 82, respectively, as shown. In turn, the analog summer 72 provides a summed output signal on signal path 30 which is sampled by the sampler circuit 28 (of FIG. 1). For reference, it will be recognized that the output samples from the sampler circuit 28 are provided to the timing circuit 34 (of FIG. 1) as well as to the analog Viterbi decoder (not shown), for generation of a sampling clock, descrambling of ISI and final decoding of the retrieved information. As indicated hereinabove, these subsequent operations of the PR-4 channel are conventional and as such are not part of the present invention (see previously incorporated U.S. Pat. Nos. 5,430,768 and 5,459,759).

In furthering an understanding of the present invention, reference is now made back to the frequency response curves 43, 45, 47 and 49 of the delay sections 42, 44, 46 and 48 as shown in the graphs of FIGS. 3b–3e. Particularly, as analog signals propagate through the delay sections 42, 44, 46 and 48, the signals undergo frequency-domain filtration in a deliberate, prescribed and programmed manner. To facilitate such sequential filtration of the propagating signals, the parameters of the individual transfer functions of the delay sections 42, 44, 46 and 48 are controllable (by way of busses 328 and 382 shown in FIGS. 1 and 3) and, in practice, are optimized to actual head-media characteristics and track radius (frequency scale). Additionally, as explained below, the filtration is performed without significant phase distortions.

It will be recognized that the magnitude response at the output of any selected one of the delay sections 42, 44, 46 or 48 will generally be the product of the magnitude responses of all preceding delay sections and the selected delay section. By deliberately choosing optimal magnitude responses of previous individual delay sections and of the selected delay section (tap), two significant, cumulative effects are obtained. First, at a "chosen" tap location (either 52, 54, 56 or 58), the magnitude response can represent a good approximation to a desired (target) shape that maximizes signal/noise ratio. In the preferred embodiment, the "chosen" tap location is tap location 54, which is the main tap location of the equalizer. As will be recognized, the main tap location is the tap location which supplies the most energy to the output of the transversal equalizer so that the overall frequency response of the system is dominated primarily by the signal from the main tap location. For reasonably symmetric input pulses, the main tap is the middle tap of the equalizer (but this is not required). Even though the main tap (tap location 54) provides filtration as the cumulative result of filtrations only from two delay sections 42 and 44, as will be described in more detail hereinbelow, the resulting tap signal represents a reasonably good approximation of an ideal PR-4 signal shape in the frequency domain (see FIG. 2b as well as curve 414 shown in FIG. 15, to be discussed hereinbelow).

The second cumulative effect from the optimization of the magnitude responses in the delay sections 42, 44, 46 and 48 is the effective elimination of extra passband; in other words, a reduction of filter sensitivity to noise (and unwanted signal components) in the channel band-reject zone is achieved. As frequency-domain filtration by the transversal equalizer 16 is completed before sampling, it is possible to chose the transfer function parameters for the delay sections 42, 44, 46 and 48 so as to minimize the effects of aliasing during sampling.

Before continuing with a discussion of the construction and operation of the circuit elements disclosed thus far in FIGS. 1 and 3, it will be useful to first review the underlying theory of the double-domain transversal equalizer 16, which is a major generalization of the theory of the optimal adaptive transversal equalizer (as presented in the previously incorporated Gersho reference; it may be found helpful for those skilled in the art to compare on step-by-step basis the derivations presented below with those found in the Gersho reference).

To derive equations which describe the operation of the analog transversal equalizer 16, and which can verified and simulated using computer automated tools, time must first be quantized. For derivation purposes, it has been found useful to consider the sampling rate (clock) of the sampler circuit 28 (of FIG. 1) to be at a frequency that is 20 times the bit rate. Such oversampling, of course, is not a physical feature of the filtering system of FIG. 1 (during normal operation sampler circuit 28 samples at the bit rate), but such oversampling is useful for purposes of simulation and analysis.

Although the transversal equalizer 16 (of FIG. 1) operates with relatively "noisy" signals at its input, the following discussion first examines an ideal, noise free input. This is because, as will be clear from the following description, the adaptive tap weight control circuit 24 compensates for errors in the equalized signal shape, not errors caused by random noise. Therefore, in the absence of input noise, the output $Y_n$ of the double-domain filter sampled at moments nQ is the weighted sum of signals from all taps k and is given as:

$$Y_n = C_1 X_{1n} + C_2 X_{2n} + \ldots C_k X_{kn} + \ldots + C_m X_{mn} \quad (3)$$

where $X_{1n}$ is the input (prefiltered) signal, $X_{kn}(k \geq 2)$ are the signals at tap k at moment nQ, $C_k$ are multiplying coefficients at tap k and Q is an arbitrary sampling (oversampling) interval.

The sum of squared errors of equalization (Least Mean Square or LMS criterion, which is given by Gersho), also called the error function, is given as:

$$e = \sum_n (Y_n - d_n)^2, \quad (4)$$

where $d_n$ is the (target) sequence of desired (sampled) values of an ideally equalized output signal at moments nQ. In general, if the input signal to the double-domain filter is not known, the values of $d_n$ will also not be known. Reliable estimates of these values may be obtained, however, as discussed below.

The error function (4) is a function of m tap weights and it forms some continuous convex surface at an m-dimensional hyperplane. This function has a minimum at the point where all partial derivatives of it relative to tap weights $C_k$ $$\frac{\partial e}{\partial C_k} = 2 \sum_n (Y_n - d_n) \frac{\partial Y_n}{\partial C_k} \quad (5)$$

are equal to zeros (substitute $Y_n$ from (3) into (5)):

$$\sum_n (Y_n - d_n) \cdot X_{kn} = 0, \quad 1 \leq k \leq m. \quad (6)$$

Equation (6) is the system of m linear equations for m unknown tap weights $C_k$. Consequently, the solutions of these equations results in optimal tap coefficients for a noise-free double-domain transversal equalizer with minimal Mean Squared Error (MSE) of (the signal shape) equalization. Thus, the achieved MSE is the quantity given by equation (4) divided by n for the case of optimal tap weights.

There are significant differences between the derivations presented above and those of the Gersho reference. Firstly, $X_{kn}$ are the filtered (in a cumulative manner, inside of the double-domain transversal equalizer) signals, not simply delayed input signals. This provides additional degrees of freedom during equalization. Secondly, Gersho presented the case of a completely known input signal, but generally the input signal is not known. Lastly, the sampling is performed with an arbitrary sampling interval Q, not with a bit-rate interval T, although a bit-rate sampling is the particular case of a sampling with an arbitrary interval Q.

It will be recognized that the system of linear equations (6) is not represented in a ready matrix form. The actual expressions for the matrix elements turn out to be rather complicated, and they depend on the actual input signal. Tedious and lengthy manipulations have generally been required to solve for these expressions using the given $d_n$ sequence in equation (6). However, explicit solution of the linear equations (6) is not necessary in practice, as these can be interpreted in an alternative manner as follows.

The left-hand-sides of equations (6) are the "noise-free" crosscorrelations ("deterministic" as described by Gersho) between error sequence $$Y_n - d_n \quad (7)$$

and Tap signal sequences $X_{kn}$. Equations (6) stipulate that these crosscorrelations must have zero values, which holds therefore for the double-domain transversal equalizer 16, and not only for the conventional transversal equalizers of the previous art (in its form equation (6) is identical to those of Gersho, but $X_{kn}$ and the sampling interval has different meaning).

This interpretation provides the leverage for an adaptive solution of the system of linear equations (6) without knowledge of the coefficients of the equations. The solution is achieved by an iterative, one-step-at-the-time reduction of all crosscorrelation to zeros by (small) adjustment in the tap weights (provided on signal paths 51, 53, 55, 57 and 59 in FIG. 3).

As will be discussed more fully below, the adaptive tap weight control circuit 24 operates at the bit-rate and is generally immune to noise. The adaptive tap weight control circuit 24 solves (iteratively) equations (6) to achieve equalization of a noise-free input signal. In other words, in actual hardware implementation of the circuit of FIG. 3, the residual (filtered) noise will be present at the output, because the adaptive subsystem "does not see" and thus "does not fight" its presence there. The noise, however, has a very small effect on the results of adaptation (only affecting the speed of such adaptation) and the adaptive tap weight control circuit 24 equalizes the signal (in LMS sense) only relative to its shape. The task of noise reduction is actually "assigned" to the controllable frequency domain functions of the double-domain transversal equalizer 16.

Figure 4:
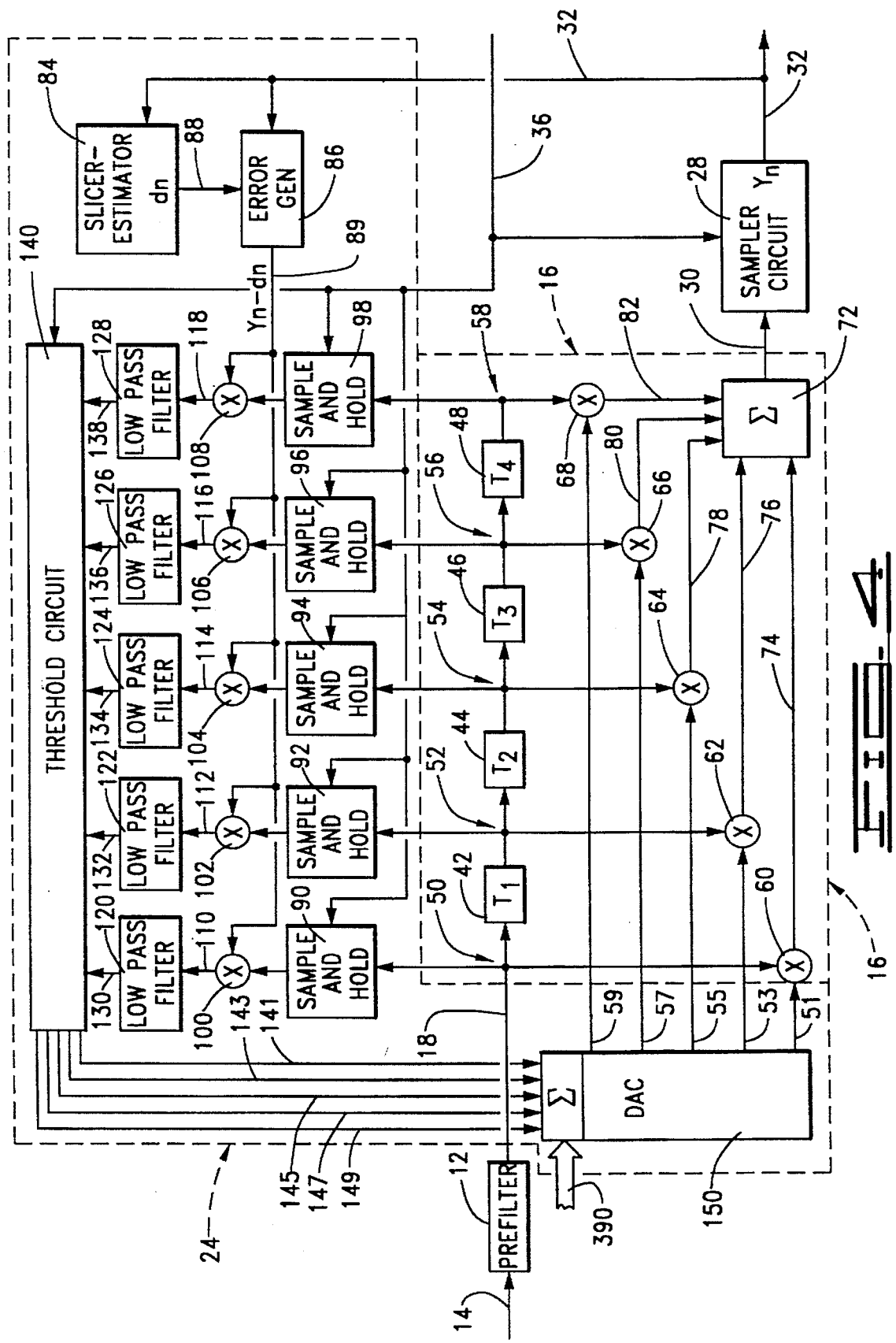
FIG. 4 is a functional block diagram of a first embodiment of the adaptive tap weight control circuit of FIG. 1, shown operably connected to the transversal equalizer, the sampler circuit and the prefilter of FIG. 1.

Referring now to FIG. 4, shown therein is a functional block diagram of the adaptive tap weight control circuit 24 operably connected to the transversal equalizer 16 and the sampler circuit 28 of FIG. 1. As provided hereinabove, the input signal from the head (not shown) is preliminarily filtered by the prefilter 12, and then provided to the transversal equalizer 16, which in turn performs both time and frequency-domain filtering to provide an analog output signal to the sampler circuit 28. The sampler circuit 28 performs discrete sampling (at the bit-rate as provided by the clock signal on signal path 36) of the analog output signal to provide sample values "$Y_n$" (by way of signal path 32) to a conventional slicer-estimator circuit 84 and to an error generator circuit 86. It will be recognized that in a PR-4 channel, there are three possible nominal sample values, −1, 0, +1. Thus, the slicer-estimator circuit 84 uses two threshold levels (−0.5 and +0.5) to provide corresponding estimated values $d_n$ (in response to the sample values $Y_n$ from the sampler circuit 28) to the error generator circuit 86 by way of signal path 88, and the error generator circuit 86 in response thereto operates as a summing circuit to generate an estimated error "$Y_n - d_n$" (equation (7)) on signal path 89.

The adaptive tap weight control circuit 24 is also shown in FIG. 4 to comprise five sample and hold circuits 90, 92, 94, 96 and 98, which sample (at the bit rate) and hold the tap signals ("$X_{kn}$") provided from the tap locations 50, 52, 54, 56 and 58, respectively, of the transversal equalizer 16. The sampled tap signals are in turn provided to multipliers 100, 102, 104, 106 and 108, respectively, which multiply the received sampled tap signals by the estimated error signal "$Y_n - d_n$" from the error generator circuit 86 (by way of signal path 89). Thus, the multipliers provide sampled values of the crosscorrelations on signal paths 110, 112, 114, 116 and 118, respectively, which are the members of the sum on the left-hand-side of equation (6).

It will be recognized that, due to noise and signal shape distortions, the slicer-estimator circuit 84 and the error generator circuit 86 may make occasional errors in the determination of the estimated error signal $Y_n - d_n$, with the consequence that the sampled values of crosscorrelations in individual cycles may not always be correct. However, the effects of these errors are minimized through the integration of these signals in low pass filters 120, 122, 124, 126 and 128, respectively.

The outputs of the low pass filters 120, 122, 124, 126 and 128 are provided by way of signal paths 130, 132, 134, 136 and 138, respectively, to a threshold circuit 140. The threshold circuit 140 acts as a counter circuit to increment or decrement the values of the tap weights ("$C_k$") in registers (shown generally as a summer) of a digital to analog converter (DAC) 150 by way of signal paths 141, 143, 145, 147 and 149, respectively, as the signals accumulated in the low pass filters 120, 122, 124, 126 and 128 exceed predetermined thresholds (for clarity, the signal paths 141, 145, 145, 147 and 149 are shown collectively as bus 70 in FIGS. 1 and 3). In this way, the values of the analog tap weights provided by the DAC 150 to the multipliers 60, 62, 64, 66 and 68 of the transversal equalizer 16 by way of signal paths 51, 53, 55, 57 and 59 are adaptively controlled in response to the control signals provided to the DAC 150 on signal paths 141, 143, 145, 147 and 149, respectively. The initial values stored in the registers (not shown) of the DAC 150 are provided by the disc drive microprocessor by way of the channel interface 26 and bus 390 (also shown in FIG. 1), but thereafter the values in the registers, and hence the values of the analog tap weights, are adaptively controlled by the circuitry of the adaptive tap weight control circuit 24, resulting in adaptive, time-domain equalization of the signal input to the transversal equalizer 16.

It will now be understood that, as the adaptive tap weight control circuit 24 includes the use of an integration function (by way of the low pass filters 120, 122, 124, 126 and 128), the adaptive tap weight control circuit 24 has a relatively low sensitivity to noise, albeit at the price of speed. Additionally, the use of this integration function neutralizes the effect of signal aliasing that may occur in the sample and hold circuits 90, 92, 94, 96 and 98. For purposes of clarity, it will be noted that the sampler circuit 28, the sample and hold circuits 90, 92, 94, 96 and 98, and the threshold circuit 140 are clocked by the clock signal provided on signal path 36 (from the timing circuit 34 as shown in FIG. 1).

Figure 5:
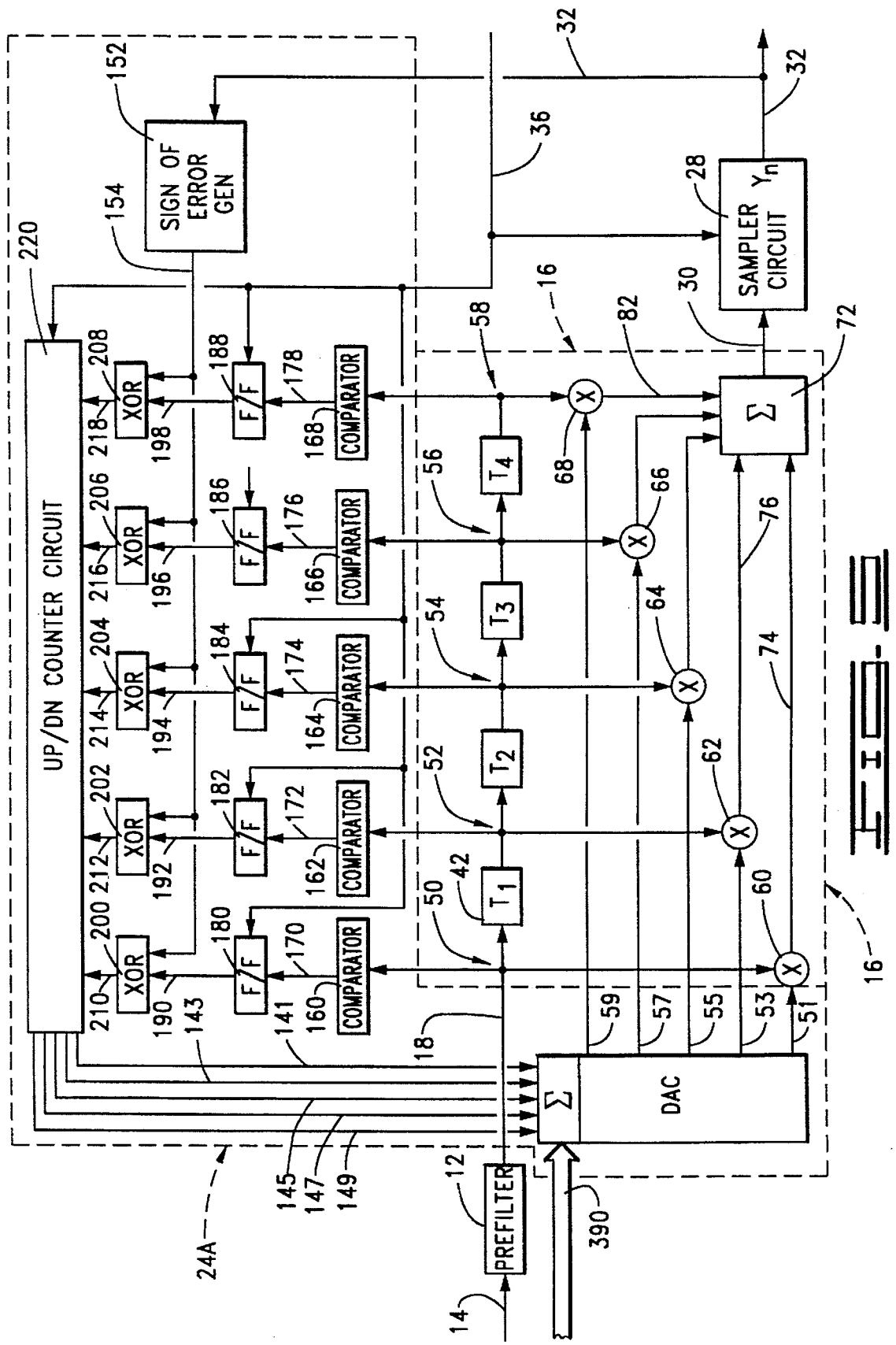
FIG. 5 is a functional block diagram for a second embodiment of the adaptive tap weight control circuit of FIG. 1, shown operably connected to the transversal equalizer, the sampler circuit and the prefilter of FIG. 1.

As an alternative to the adaptive tap weight control circuit 24 shown in FIG. 4, FIG. 5 has been provided which shows a second embodiment of the adaptive tap weight control circuit (for purposes of clarity identified therein as item 24A). The adaptive tap weight control circuit 24A of FIG. 5 is implemented digitally, and thus provides a less complex realization in hardware, but correspondingly provides slower adaptation of the tap weights.

As with the circuit of FIG. 4, FIG. 5 shows the transversal equalizer 16, the prefilter 12 and the sampler circuit 28, which operate as before in response to an input signal from the head (not shown). However, the adaptive tap weight control circuit 24A uses what will be recognized as the "Sign-Sign LMS" adaptation methodology. That is, instead of determining an iterative solution of equation (6) directly (as with the circuit of FIG. 4), the circuit of FIG. 5 achieves an iterative solution of simplified equations $$\sum_n \text{Sign}\,[(Y_n - d_n)] * \text{Sign}\,[X_{kn}] = 0, \qquad 1 \le k \le m. \qquad (8)$$

Thus, the sampled analog output signal from the sampler circuit 28 is provided to a sign of error generator circuit 152 (by way of signal path 32). The tap signals from the tap locations 50, 52, 54, 56 and 58 of the transversal equalizer 16 are provided to zero-threshold comparators 160, 162, 164, 166 and 168, respectively, which in turn provide outputs by way of signal paths 170, 172, 174, 176 and 178 to flip-flops 180, 182, 184, 186 and 188, respectively. The clocked outputs of the flip-flops 180, 182, 184, 186 and 188 are presented on signal paths 190, 192, 194, 196 and 198 and undergo respective exclusive-or (XOR) operations with the output of the sign of error generator circuit 152 (provided on signal path 154) in XOR gates 200, 202, 204, 206 and 208. The XOR outputs from the XOR gates 200, 202, 204, 206 and 208 are next provided (by way of signal paths 210, 212, 214, 216 and 218) to an up/down synchronous counter circuit 220, which also provides the requisite integration function during operation. That is, for each input from the XOR gates 200, 202, 204, 206 and 208, registers (not shown) are provided in the up/down synchronous counter circuit 220 which are separated into least-significant-bit (LSB) and most-significant-bit (MSB) registers, and the integrating effect is emulated by having no direct output to the final tap weight registers of the DAC 150 (by way of signal paths 141, 143, 145, 147 and 149) from the LSB registers. Thus, adaptation is achieved by the digital circuit of FIG. 5, but at a slower rate than that of the circuit of FIG. 4, in that the passage of a number of clock cycles is necessary to effect minimal changes in the tap weights $C_k$. It will be recognized that FIG. 5 is a digital-based implementation (the clock signals for the flip-flops 180, 182, 184, 186 and 188 as well as the up/down synchronous counter circuit 220 are shown provided on signal path 36 from the timing circuit 34 of FIG. 1), whereas FIG. 4 discloses an analog-based implementation for the adaptive tap weight control circuit 24.

Having concluded the discussion of FIGS. 4 and 5, the construction and operation of the delay sections 42, 44, 46 and 48 of the transversal equalizer 16 (as shown in FIGS. 3–5) will now be addressed. As provided hereinabove, the delay sections 42, 44, 46 and 48 provide both bit-interval delay and (cumulative) frequency-domain filtering, and this frequency-domain filtering is performed without introducing significant phase distortions. To achieve this result, the transfer functions of the delay sections 42, 44, 46 and 48 all have the same linear phase polynomial in the denominator, but have different real (at s=jω)) numerators. In such an arrangement, the numerator provides the desired frequency domain filtration without affecting the value of the section delay, the delay being determined only by the denominator of the transfer function. In other words, the time and frequency-domain filtration operations are independent from each other. The transfer function of each of the delay sections 42, 44, 46 and 48 can be given as:

$$T(s) = \frac{K_2 s^2 + K_0 a_0}{s^4 + a_3 s^3 + a_2 s^2 + a_1 s + a_0} \quad (9)$$

where $a_0$, $a_1$, $a_2$ and $a_3$ are coefficients of a fourth-order linear equiripple phase polynomial (with 0.05 degree ripple). This polynomial was disclosed by D. S Humpherys in an article entitled "EQUIRIPPLE NETWORK APPROXIMATIONS USING ITERATION TECHNIQUES", Proceedings of National Electronics Conference, vol. 20 pp. 753–758, 1964, incorporated herein by reference. It will be recognized that Equation (9) is only one possible realization of the transfer function of the delay sections 42, 44, 46 and 48.

Additionally, the terms $K_0$ and $K_2$ in Equation (9) are coefficients which, as described in more detail below, determine the location of zeros in the transfer function for each section; particularly, when $K_0=1$ and $K_2>0$, the delay section operates as a low pass band reject filter; when $0<K_0<1$ and $K_2<0$, the delay section acts as a band pass filter; when $K_0>0$ and $K_2=0$, the delay section acts as a low pass filter; and when $K_0=1$ and $K_2<0$ (and is near zero), the delay section acts as a low pass filter with a small amount of boost. Accordingly, for purposes herein, the filter operation will be characterized as being in a "boost" mode for $K_2<0$, a "notch" mode for $K_2>0$, and "none" for $K_2=0$.

Figure 6:
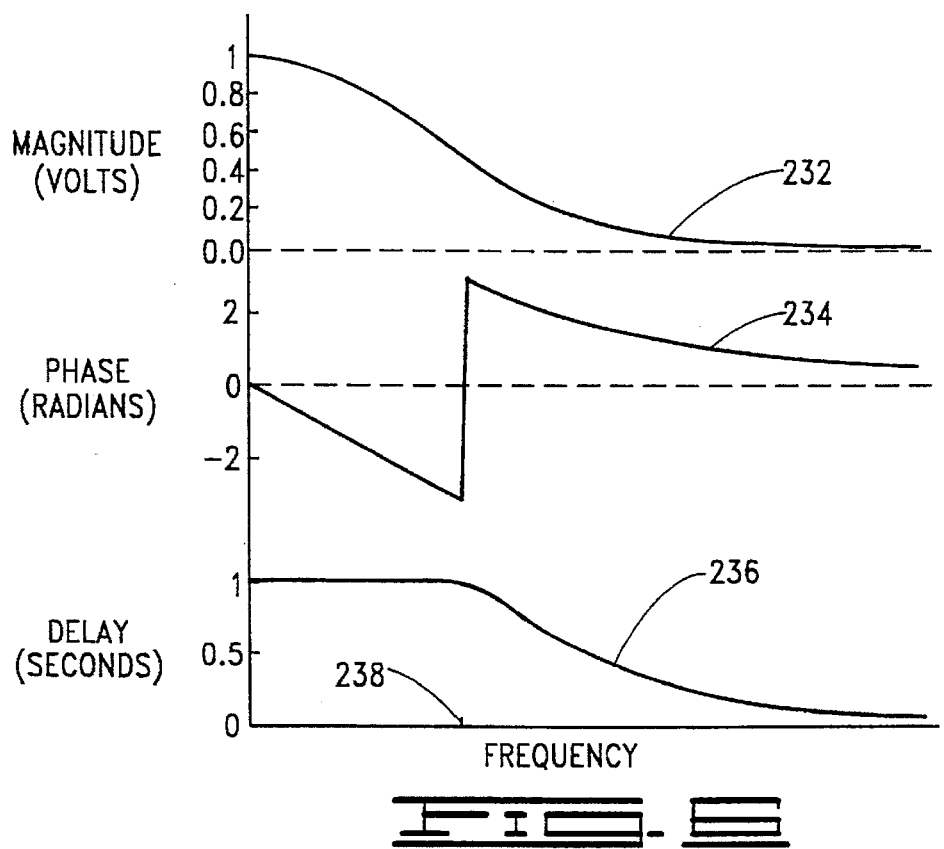
FIG. 6 provides graphical representations of a magnitude response curve, a phase response curve and a delay response curve of a delay section of the transversal equalizer of FIG. 3 configured so as to operate as a low pass filter.
Figure 7:
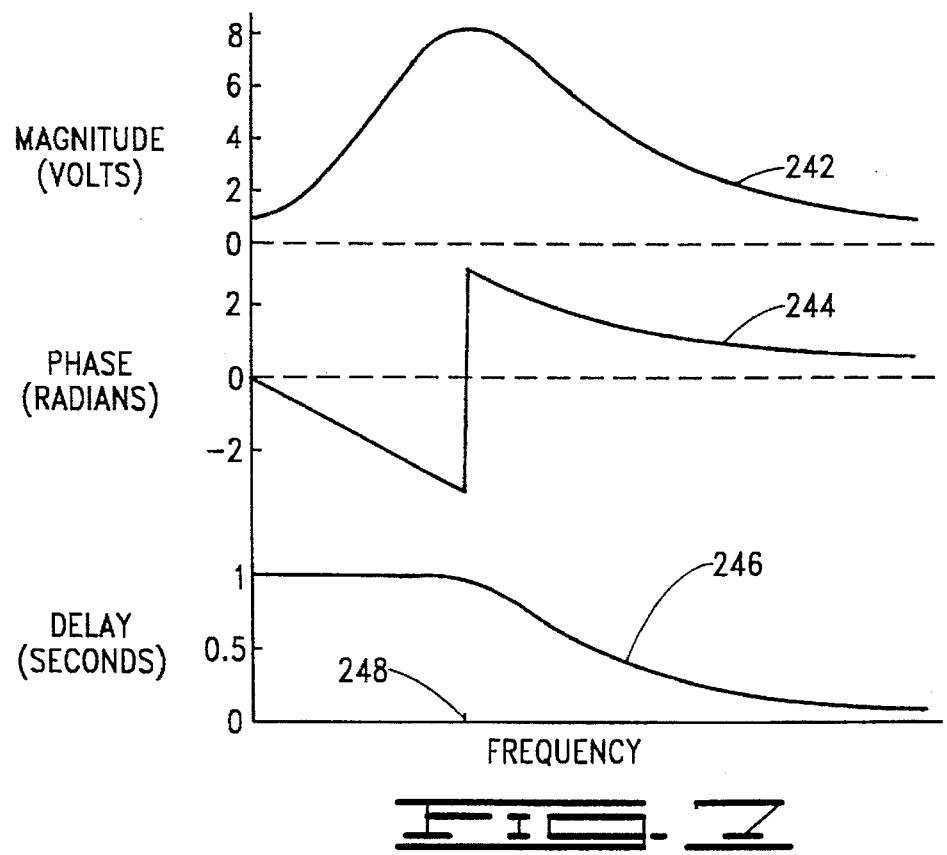
FIG. 7 provides graphical representations of a magnitude response curve, a phase response curve and a delay response curve of a delay section of the transversal equalizer of FIG. 3 configured so as to operate as a band pass filter.
Figure 8:
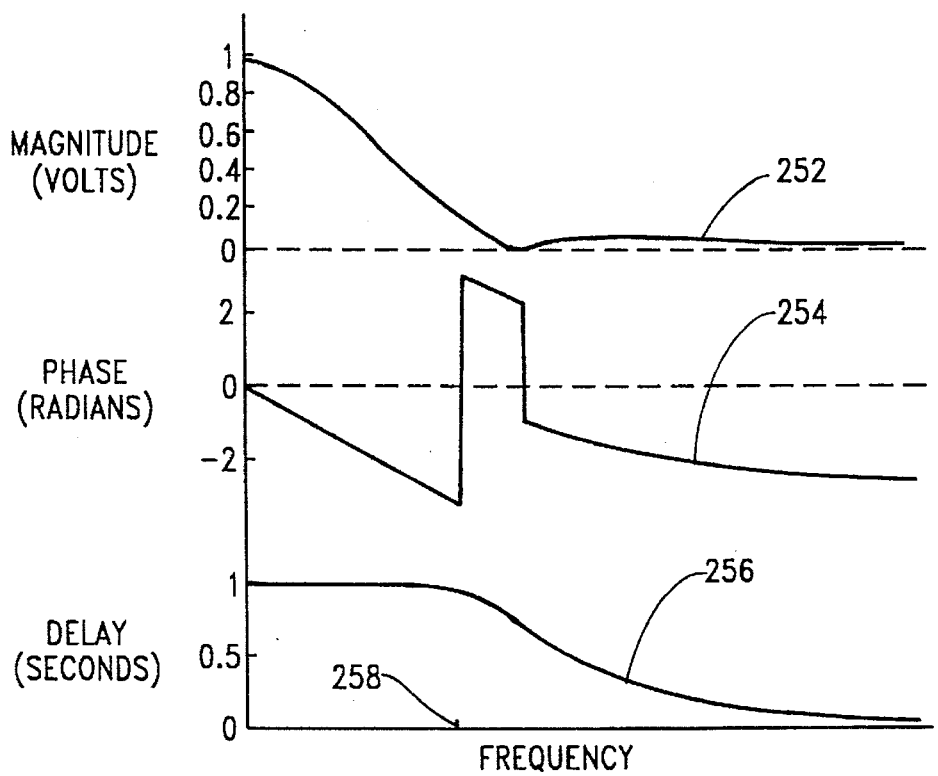
FIG. 8 provides graphical representations of a magnitude response curve, a phase response curve and a delay response curve of a delay section of the transversal equalizer of FIG. 3 configured so as to operate as a low pass, band reject filter.

FIGS. 6, 7 and 8 provide graphical illustrations of the general magnitude, phase and delay response (with respect to frequency) of the delay sections 42, 44, 46 and 48, for operation in these "none", "boost" and "notch" modes of operation, respectively. More particularly, FIG. 6 shows a magnitude response curve 232 (in volts), phase response curve 234 (in radians) and a delay response curve 236 (in seconds) of a delay section configured in the "none" mode, so as to operate as a low pass filter (such as delay sections 46 and 48 of FIG. 3). The horizontal axis of FIG. 6 represents frequency, with a frequency cut-off boundary (between the channel band-pass and band-reject areas) indicated at 238. As shown, the phase response is generally linear over the channel band-pass frequency range.

In like manner, FIG. 7 provides a magnitude response curve 242, phase response curve 244 and delay response curve 246 of a delay section configured in the "boost" mode, so as to operate as a band pass filter with boost (such as delay section 44 of FIG. 3). Again, the boundary between the channel band-pass and band-reject is indicated at 248. Finally, FIG. 8 provides a magnitude response curve 252, phase response curve 254 and delay response curve 256 of a delay section configured in the "notch" mode, so as to operate as a low pass, band reject filter (such as delay section 42 of FIG. 3). As in FIGS. 6 and 7, the boundary between the channel band-pass and band-reject frequency in FIG. 8 is indicated at 258. It will be recognized that the magnitude response curves 232, 242 and 252 in FIGS. 6–8 are generally similar in shape to the previously discussed frequency response curves 13, 43, 45, 47 and 49 of FIGS. 3a–3e.

Although various methodologies may exist to realize the delay sections 42, 44, 46 and 48 of the present invention, generally the only economically viable option in mass-produced magnetic storage devices is to realize the delay sections on the silicon die of the channel LSI chip. Such integrated filters based on transconductors and integral capacitors which are programmable with respect to their transfer functions, and variable in frequency scale are known in the prior art (see, for example U.S. Pat. No 5,392,171 entitled "FULLY INTEGRATED PROGRAMMABLE FILTERS FOR DISC DRIVE SUBSYSTEMS", issued Feb. 21, 1995 to Kovner et al., assigned to the assignee of the present invention and incorporated herein by reference).

FIG. 9 provides a schematic block diagram of a prior art second-order integral filter 260 (hereinafter "filter") employing the use of transconductors and integral capacitors. More particularly, the filter 260 comprises five controllable transconductors 262, 264, 266, 268 and 270 (also denoted as $g_{m1}$, $g_{m2}$, $g_{m3}$, $g_{m4}$ and $g_{m5}$ respectively) and two integral capacitors 272 and 274 (also denoted as $C_1$ and $C_2$, respectively). Additionally, voltage input terminals for voltages denoted as $V_A$, $V_B$ and $V_C$ are shown at 276, 278 and 280, respectively, and the output voltage $V_O$ is shown at 282. As described in the tutorial paper "ACTIVE FILTER DESIGN USING OPERATIONAL TRANSCONDUCTANCE AMPLIFIERS" by R. L. Geiger and E. Sanches-Sinencio, IEEE Circuit and Devices magazine, vol. 1, No. 2, March 1985, pp. 20–32 (incorporated herein by reference), the transfer function of the filter 260 is given as:

$$V_0 = \frac{s^2 C_1 C_2 V_C + s C_1 g_{m4} V_B + g_{m2} g_{m5} V_A}{s^2 C_1 C_2 + s C_1 g_{m3} + g_{m2} g_{m1}} \quad (10)$$

with C1 and C2 being the capacitance values of capacitors 272 and 274, $g_{m1}$, $g_{m2}$, $g_{m3}$ and $g_{m4}$ being the transconductance values of transconductors 262, 264, 266, 268 and 270, respectively (which are controlled by the bias current provided on signal paths 284, 286, 288, 290 and 292, respectively).

From this basic structure, the transfer functions and building blocks necessary to realize all versions of the transfer function (9) "employed" in the presented description may be derived (it will be recognized, of course, that other types of building blocks may be utilized in achieving the transfer function (9) above).

The (combined) transfer functions are given by the formula:

$$V_0 = \frac{s^2 C_1 C_2 V_C + g_{m2} g_{m5} V_A}{s^2 C_1 C_2 + s C_1 g_{m3} + g_{m1}} \quad (11)$$

Much simpler structures are possible (see the same reference) if the ratio of the two integral capacitors C1 and C2 is fixed to a desired value, which is readily achievable in monolithic implementations. The corresponding structure is shown in FIG. 10, which provides the preferred embodiment for the structure for each of the delay sections 42, 44, 46 and 48 of the transversal equalizer 16 of FIG. 3. For purposes of clarity, the circuit of FIG. 10 is generally denoted as item 300, although it will be readily understood that this circuit corresponds to each of the delay sections 42, 44, 46 and 48, with the circuit 300 receiving different input control signals in accordance with the desired time and frequency-domain response of each of these sections, as provided hereinbelow.

As shown in FIG. 10, two second-order filter stages (generally denoted as 302 and 304) are connected in series (to achieve the required fourth-order transfer function), with the second-order filter stages 302 and 304 comprising transconductors 306, 308 and 310, 312, respectively, as well as integral capacitors 314, 316 and 318, 320. An analog buffer 322 having complementary outputs and an analog multipliers 324, 325 are also shown connected to the first second-order filter stage 302.

During operation of the circuit 300 of FIG. 10, input signals are provided on input signal path 326 (input signal path 326 corresponding to a selected one of the tap locations 50, 52, 54 or 56 of FIG. 3) and, depending upon the desired frequency response of the circuit 300, a positive voltage signal (the coefficient $K_2$ providing "notch" mode), a negative voltage signal ($K_2$ providing "boost" mode) or ground ($K_2$ providing "none" mode) is supplied to the analog multiplier 324 by way of bus 328 (additionally, it will be recognized that the bus 328 also provides a corresponding signal to the analog multiplier 325 for the coefficient $K_0$). These control signals on bus 328 are provided from the location of zeros control circuit 20 (FIG. 1), which comprises a plurality of digital-to-analog converters (not separately shown), each of which output the analog control signal in response to a digital control signal provided from the system microprocessor (not shown) by way of the channel interface circuit 26 and input bus 344 (FIG. 1). In this way, the locations of zeros in the transfer functions for (and hence the frequency response of) the delay sections 42, 44, 46 and 48 are controlled in a programmed manner.

It will be recognized that the signals on bus 328 from the location of zeros control circuit 20 control the voltage $V_C$ (at point 348), and this voltage corresponds to the coefficient $K_2$ in equation (9), and thus controls the magnitude and polarity of the $s^2$ ($\omega^2$) term in the numerator of this equation. Additionally, the signals on bus 328 also control the voltage $V_A$ (at point 352), which corresponds to the coefficient $K_0$ in equation (9). It will be further recognized that, unlike the first filter stage 302, the second filter stage 304 does not have corresponding signal paths for varying the voltages $V_C$ and $V_A$ (at points 350 and 354); rather, the voltage $V_C$ is equal to ground and the voltage $V_A$ is the output voltage from the first filter stage 302, resulting in the second filter stage 304 acting as a low pass filter.

In addition to the location of zeros control of the circuit 300 of FIG. 10 in response to the input control signal on bus 328, time and frequency-domain scaling of the circuit 300 occurs through the application of bias current signals to the transconductors 306, 308, 310 and 312 by way of signal paths 336, 338, 340 and 342, respectively (the signal paths 336, 338, 340 and 342 are included in the general signal bus 382 shown in FIG. 1). More particularly, the current signals on signal paths 336, 338, 340 and 342 control the transconductance values ($g_m$) of the transconductors 306, 308, 310 and 312, thereby controlling the denominator of the transfer function (equation (9)) of the circuit 300. As provided above, during operation the time delay is set to correspond to a one-bit delay for each of the delay sections 42, 44, 46 and 48 and this is accomplished by the bias currents provided on the signal paths 336, 338, 340 and 342 from the delay control circuit 22 of FIG. 1 (the operation of which will be described in more detail hereinbelow).

Referring now to FIG. 11, shown therein is a table listing the mode, voltages and corresponding transfer functions of the second-order filter stages 302, 304 of FIG. 10 as configured for each of the delay sections 42, 44, 46 and 48 of the transversal equalizer 16. Particularly, the transfer functions for each of the filter stages 302, 304 are shown in response to the setting of various voltages $V_A$, $V_B$ and $V_C$. In the preferred embodiment, the transconductance values for each of the transconductors 306, 308, 310 and 312 of FIG. 10 are set to be equal in magnitude, thereby simplifying the circuit implementation (although this is not a limitation). Additionally, $\omega_O$ in FIG. 11 is the natural frequency of the second-order denominator and Q is the quality factor of the pole. As shown in FIG. 11, both the frequency response and the time and frequency scale may be readily controlled as desired to achieve the necessary time and frequency-domain filtering by the transversal equalizer 16.

Figure 12:
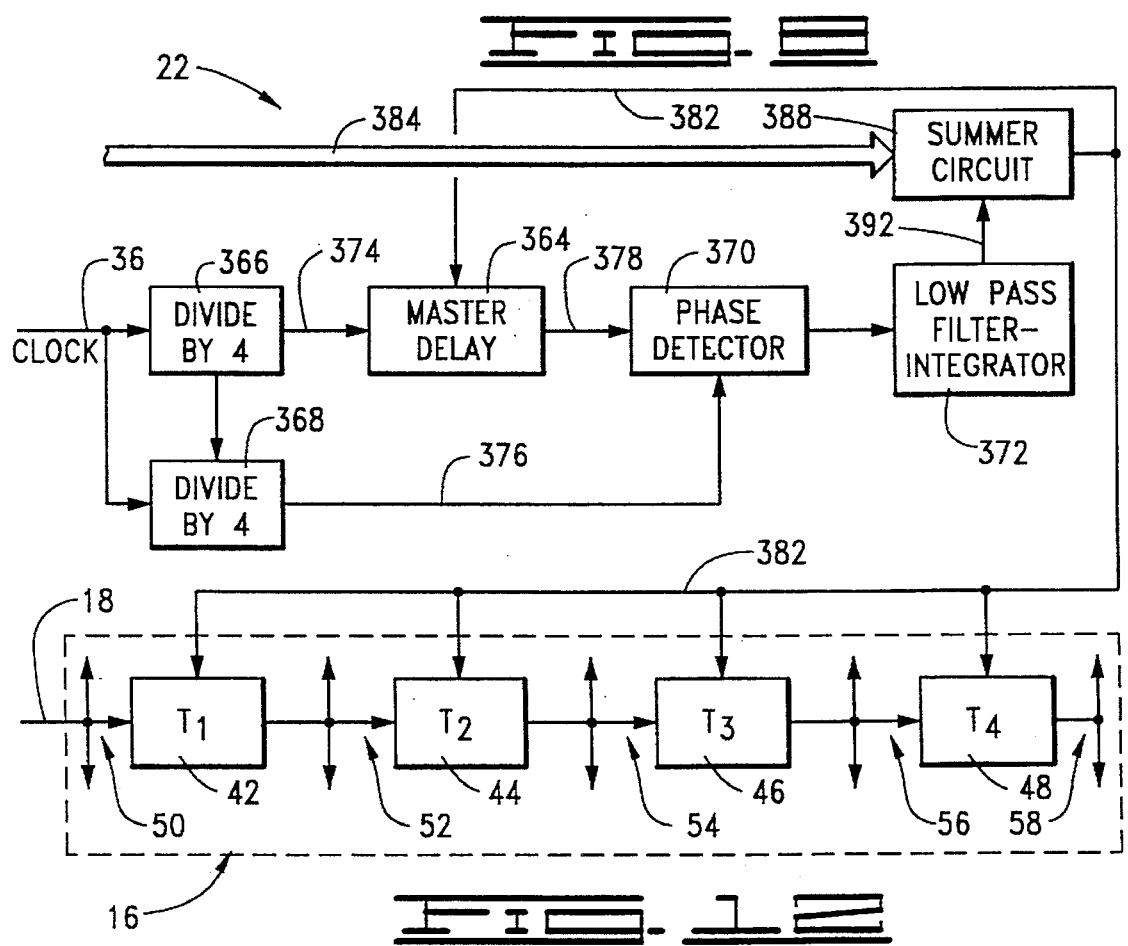
FIG. 12 is a functional block diagram of the delay control circuit of FIG. 1, shown operably connected to the transversal equalizer of FIG. 3.

Referring now to FIG. 12, shown therein is a functional block diagram of the delay control circuit 22 of FIG. 1, shown operably connected to the delay sections 42, 44, 46 and 48 ($T_1$, $T_2$, $T_3$ and $T_4$) of the transversal equalizer 16. As provided hereinabove, proper operation of the filtering system 10 generally requires tight control of the delay values in the delay sections 42, 44, 46 and 48, irrespective of changing environmental and operational conditions.

The delay control circuit 22 of FIG. 12 is shown to comprise a MASTER delay element 364, two divide by four circuits 366 and 368, a phase detector 370, a low pass filter-integrator 372 and an analog summer circuit 388. Generally, the output signal from the analog summer circuit 388 on the bus 382 provides the requisite bias currents for the transconductors 306, 308, 310 and 312 of the transversal equalizer 16, as well as a feedback bias signal to the MASTER delay by way of the bus 382. In this way, the delay control circuit 22 controls the transconductance values of the transconductors 306, 308, 310 and 312 in each of the delay sections 42, 44, 46 and 48.

It will be recognized from FIG. 12 that the delay sections 42, 44, 46 and 48 are actually SLAVE delay elements, controlled by the MASTER delay element 364. For reference, to maintain the requisite tight control of the delay values of the delay sections 42, 44, 46 and 48, in the preferred embodiment these sections are manufactured simultaneously and at the same area of the die as the MASTER delay element 364, with a tight matching between all elements.

To describe the operation of the circuit of FIG. 12, an input clock signal (at the bit-rate) is supplied on signal path 36 from the timing circuit 34 (of FIG. 1) to the divide by four circuits 366, 368. As shown, the input clock rate is divided by four by the divide by four circuits 366, 368, so that output divided-by-four clock signals are outputted on signal paths 374 and 376, respectively, with the signal on signal path 376 being 90 degrees out of phase with the signal on signal path 374 (the divide by four circuit 368 is synchronized by the divide by four circuit 366). The signal on signal path 374, which is in the middle of the passband of the filtering system 10, is provided to the MASTER delay element 364, which delays the signal by an actual amount of master delay, and then outputs a signal to the phase detector 370 by way of signal path 378.

The phase detector 370 compares the signal from signal path 378 with the signal from signal path 376 as shown. Depending upon the phase difference between these two signals, the phase detector 370 outputs an error signal on signal path 380 to the low pass filter-integrator 372, which provides an integrated error signal to the summer circuit 388 by way of signal path 392.

The summer circuit 388 receives an initial (nominal) input value from the channel interface 26 by way of bus 384, and adds to this value the integrated delay error provided on signal path 392 (the summer circuit 388 includes the requisite digital-to-analog circuitry (not separately shown) to convert the digital input on bus 384 to analog). The resulting signal from the summer circuit 388 comprises the bias current signals described hereinabove which are provided to each of the delay sections 42, 44, 46 and 48. Additionally, the signal from the summer circuit 388 is provided as a closed-loop feedback signal to the MASTER delay element 364.

For purposes of clarity, it will be understood that in the preferred embodiment the bus 382 shown in FIG. 12 provides the transconductor bias currents on the signal paths 336, 338, 340 and 342 shown in FIG. 10; that is, in the preferred embodiment, the same control signal from the delay control circuit 22 is provided to each of the transconductors 306, 308, 310 and 312 in each of the delay sections 42, 44, 46 and 48 (making the $g_m$ value the same for all transconductors). However, this should not be considered a limitation, as it is contemplated that different magnitudes of bias current could be individually supplied to the transconductors 306, 308, 310 and 312, if different $g_m$ values are desired in a particular application. It will be recognized that this could be readily implemented in a variety of ways, including the use of analog summers (not shown) that add selected values from the disc drive microprocessor (not shown) and digital to analog converters (not shown) to the bias current control signal from the delay control circuit 22 to the individual transconductors 306, 308, 3 10 and 312 (FIG. 10), so that different magnitudes of bias current are supplied to the various transconductors. Of course, changing the $g_m$ values of the transconductors 306, 308, 310 and 312 in the delay sections 42, 44, 46 and 48 will correspondingly affect the individual time delays of these sections, and generally it is desirable, as provided hereinabove to have uniform time delays among these sections to obtain proper time-domain filtration in a disc drive channel.

Continuing with FIG. 12, during operation, when the MASTER delay element 364 provides a nominal delay value the two signals provided to the phase detector 370 (by way of signal paths 376 and 378) are in quadrature, resulting in a zero steady-state error from the phase detector 370 (that is, zero DC component). Otherwise, the error signal will be nonzero, in which case the error signal will be integrated (by the low pass filter-integrator 372) and then used to adjust the delays in both the MASTER delay element 364 and in the delay sections 42, 44, 46 and 48. Thus, the delay control circuit 22 operates to control and maintain the proper delay values in the delay sections 42, 44, 46 and 48 of the transversal equalizer 16, as well as to maintain proper frequency scaling of these sections.

Figure 13:
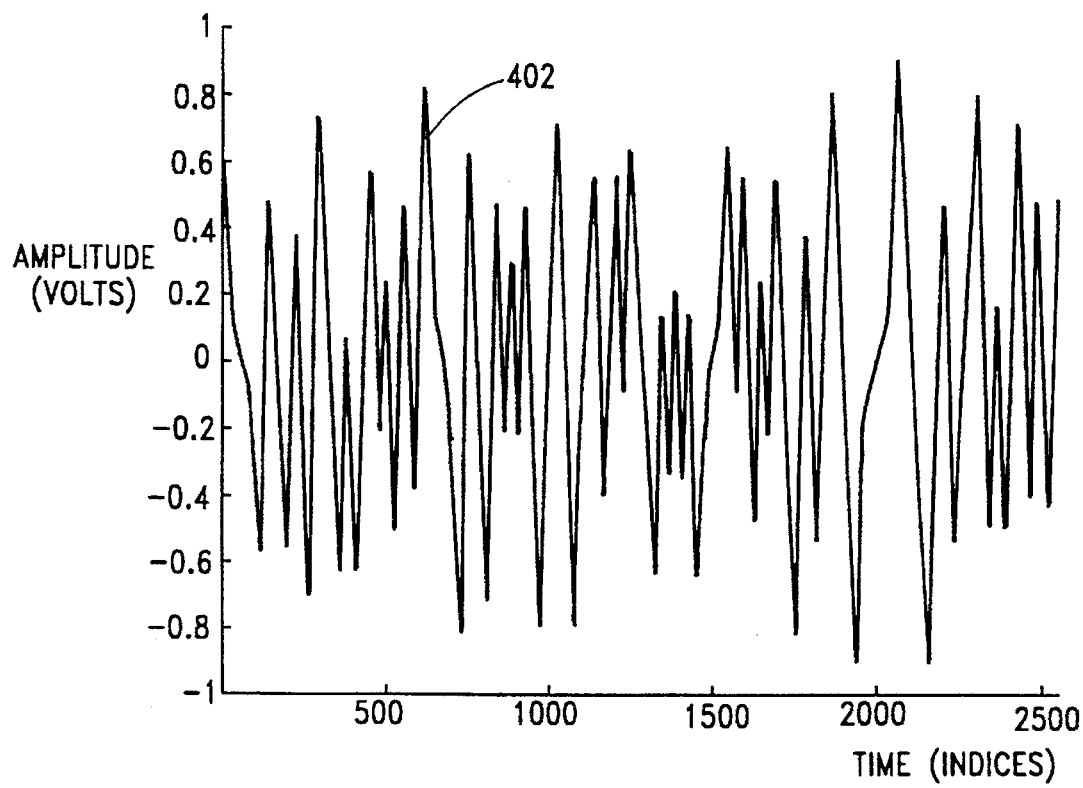
FIG. 13 provides a graphical representation of a noise-free, periodic and amplified read signal from a magnetic head, the read signal being a simulated response to a 127-bit, periodic, pseudo-random sequence of maximum length written on the disc drive media.

Having now concluded a discussion of the construction of the preferred embodiment of the present invention, selected results of computer simulations performed to analyze the operation of the present invention will be discussed. Referring now to FIG. 13, shown therein is a graphical representation of a noise-free, periodic and amplified read signal 402 from the magnetic head (not shown). More particularly, the read signal 402 is a simulated response to a 127-bit, periodic, pseudo-random sequence of maximum length written on the disc drive media. The read signal 402 is plotted against a horizontal axis indicative of time and a vertical axis indicative of the signal amplitude (in volts). As demarcated, the horizontal time axis comprises 20 time indices per bit (indicative of the 20 times oversampling mentioned hereinabove used during the computer simulations).

The particular binary sequence used to generate the read signal 402 is a useful tool in checking experimentally the performance of communication channels, as the resulting read signal 402 contains all frequency components of interest (see F. J. MacWilliams and N. J. A. Sloane, "PSEUDO-RANDOM SEQUENCES AND ARRAYS", IEEE Proceedings, vol 64, No. 12, December 1976, pp. 1715–1729). More particularly, injecting said sequence into an ideal PR-4 channel would result in a channel output spectrum having the ideal shape of curve 17 of FIG. 2b.

The transition (magnetization) response of the readback head is assumed to be represented by the Lorentzian (bell-shaped) pulse, which is usually used in the modeling of recording channels. The Lorentzian pulse is described by the formula:

$$Y(t) = \frac{1}{1+(t/T)^2}, \qquad (12)$$

where t represents time and T represents the bit interval. During the simulation, the 127-bit binary sequence used to generate the read signal 402 (of FIG. 13) resulted in the corresponding definite target periodic sequence $d_n$ for a PR-4 channel as described in equations (4)–(6). This allows for the determination of the matrix elements of equations (6), and therefore, the solution of equations (6).

Figure 14:
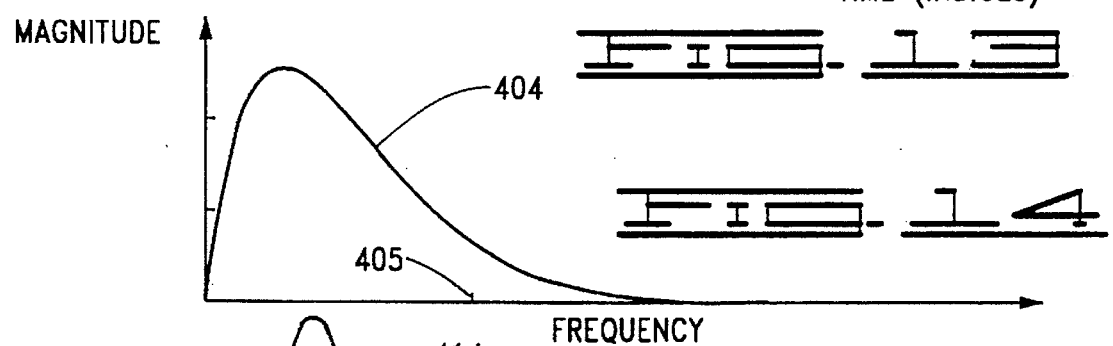
FIG. 14 provides a graphical representation of the magnitude spectrum of the read signal of FIG. 13.

Continuing with the discussion of the computer simulation of the filtering system 10 of the present invention, reference is now made to FIG. 14, which provides a graphical representation of a magnitude response curve 404, which is the magnitude spectrum of the read signal 402 of FIG. 13 with respect to frequency. As shown in FIG. 14, the magnitudes of the read signal 402 are significantly depleted in higher frequency ranges, relative to an ideal PR-4 type signal input (as shown in FIG. 2b). It will be recognized that this is generally true for all practical PR-4 channels used in magnetic recording devices and results in the necessity of boosting high frequency components in PR-4 channel filters to obtain the required response from the system. For reference, the boundary between the channel band-pass and band reject frequency ranges is identified at 405 (which corresponds to the frequency f=1/(2T) in FIG. 2b).

Figure 15:
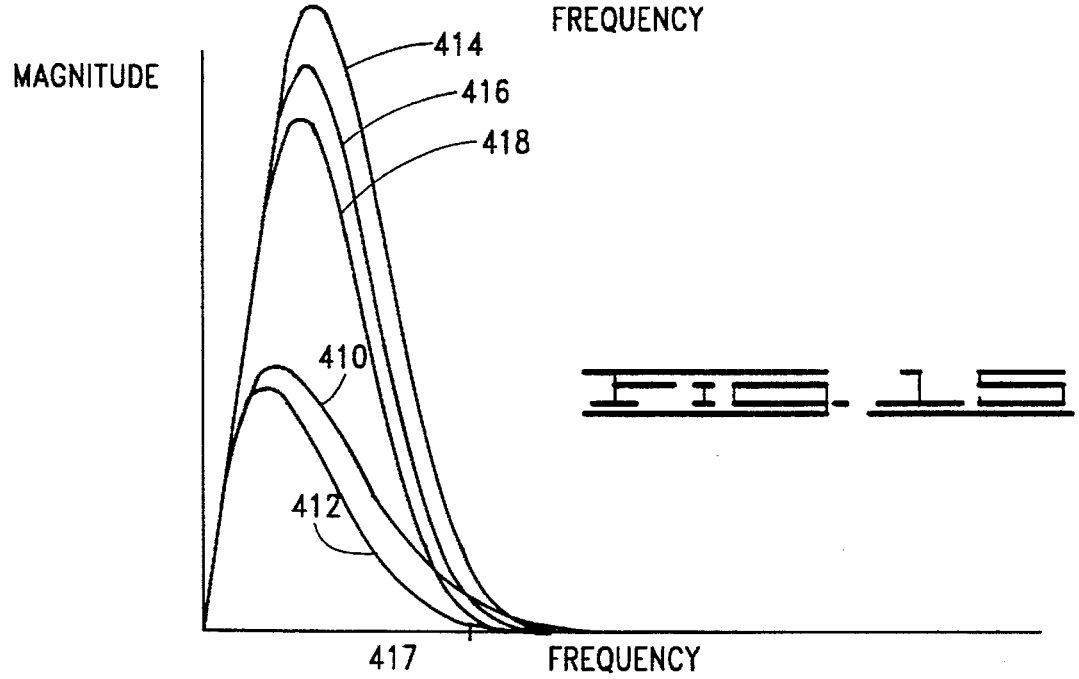
FIG. 15 provides graphical representations of the magnitude spectrums of signals present at tap locations of the transversal equalizer 16 of FIG. 3 in response to the read signal of FIG. 13.

Referring now to FIG. 15, shown therein are graphical representations of the magnitude spectrums of signals present at the tap locations 50, 52, 54, 56 and 58 of the transversal equalizer 16 of FIG. 3 obtained during simulation in response to the read signal 402. More particularly, FIG. 15 shows tap signal magnitude response curves 410, 412, 414, 416 and 418 for the tap locations 50, 52, 54, 56 and 58, respectively. As provided hereinabove, the response curves 410, 412, 414, 416 and 418 result from the cumulative effects of the frequency-domain filtering of the delay sections 42, 44, 46 and 48, in accordance with the magnitude response of the sections (as illustrated by FIGS. 3b–3e and 6–8). The boundary of the channel passband is shown at 417, which corresponds to the frequency f=1/(2T) in FIG. 2b. As shown in FIG. 15, the spectrum at the main tap location 54 (curve 414) provides a very good approximation of a target spectrum for PR-4 channel (see FIG. 2b), even though the high frequency components of the input signal are significantly depleted (as shown in FIG. 14).

Referring now to FIG. 16, shown therein is a graphical representation of the time-domain signal at the main tap location 54 in response to the input read signal 402 of FIG. 13. More particularly, FIG. 16 shows a main tap signal curve 420 that is closely matched to the target signal in the frequency domain. A portion 422 of the main tap signal curve 420 denotes a selected time (pattern) range, the significance of which will be discussed hereinbelow. Generally, however, it will be noted that the achieved frequency domain matching at the main tap alone is not sufficient for good time-domain filtration by the transversal equalizer 16.

Figure 20:
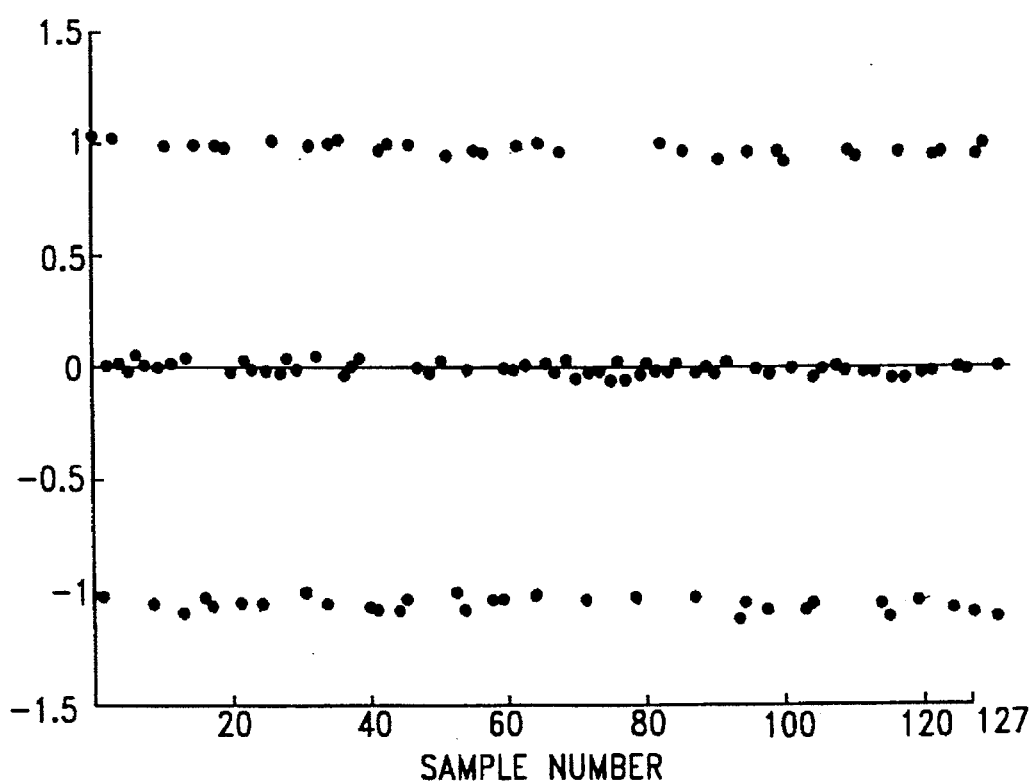
FIG. 20 provides a graphical representation of the sampling obtained as a result of the operation of the adaptive tap weight control circuit of FIG. 1, at the end of the adaptation operation referenced with respect to FIG. 19.

Continuing with FIG. 17, shown therein is a graphical representation of the equalized time-domain signal at the output of the transversal equalizer 16 (of FIG. 3) in response to the read signal 402 of FIG. 13. More particularly, FIG. 17 provides an output signal curve 424, which is a representation of the signal on signal path 30 (from the analog summer 72 of the transversal equalizer 16) after both time and frequency domain equalization has been achieved of the read signal 402. A portion 426 of the output signal curve 424 has been identified in FIG. 17 as shown, and this portion 426 corresponds to the same selected pattern range of portion 422 of FIG. 16. Ideally, the equalized read signal 402 should result in five consecutive zero samples in the selected pattern ranges of portions 422 and 426 of FIGS. 16 and 17, respectively; more particularly, the response within the selected portions 422 and 426 should be similar (with respect to the time-axis) to the superposition of ideal curve 15 of FIG. 2a (and should result in five consecutive zero values). As shown in FIG. 17, the response in the portion 426 does include five such consecutive zero values, but the response in the portion 422 of FIG. 16 does not provide such a good approximation (there being only three zero values within portion 422). Thus, although the signal present at the main tap location 54 of the transversal equalizer 16 provides reasonably acceptable frequency-domain equalization, the signal at the main tap location 54 generally does not provide acceptable time-domain equalization of the input read signal 402. Additional examples of the imprecise time-domain control provided at the main tap location 54 can be observed by further comparison of selected portions of the curve 424 in FIG. 17 to the corresponding portions of the curve 420 in FIG. 16 (as well as with the sample values shown in FIG. 20 presented hereinbelow).

Figure 18:
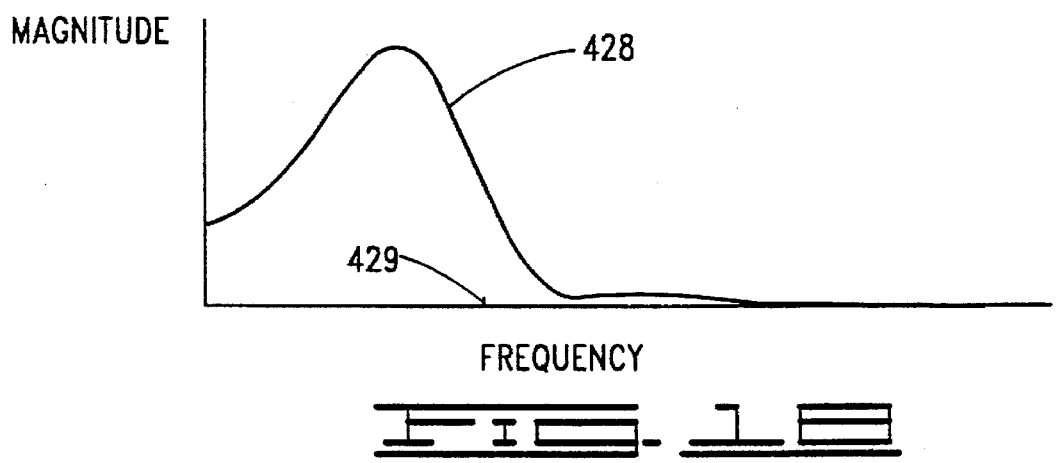
FIG. 18 provides a graphical representation of the magnitude response of the transversal equalizer of FIG. 3.

For reference, FIG. 18 has been provided which provides a graphical representation of the magnitude response of the entire transversal equalizer 16 of FIG. 3 (operated in conjunction with the prefilter 12). More particularly, FIG. 18 includes an equalizer magnitude response curve 428 plotted with respect to frequency (the pass-band boundary denoted at 429), the curve 428 providing insight into the amount of frequency boost required to obtain reasonable approximations of the idealized PR-4 waveform. Additionally, it can be seen quantitatively from FIG. 18 that the transversal equalizer 16 completes the filtration before sampling, with the result that noise (and signal) aliasing should be negligible, as channel sensitivity for out-of-passband signals is very small.

Additionally, for reference it will be noted that aforementioned simulated equalization of the filtering system 10 of FIG. 1 resulted in the following optimal tap weights (normalized as shown to the main tap) shown in Table I.

TABLE 1

| Signal Path (FIG. 3) | Tap weight coefficient |
| --- | --- |
| 51 | $C_1 = 0.39335$ |
| 53 | $C_2 = -0.56494$ |
| 55 | $C_3 = 1.00000$ |
| 57 | $C_4 = -0.14711$ |
| 59 | $C_5 = 0.12757$ |

Moreover, the resulting signal/noise ("shape-noise") ratio was about 32 dB. The relatively large tap weight coefficients $C_1$ and $C_2$ shown in Table I result from the relatively small signal magnitudes for tap locations 50 and 52, as compared to the signal magnitudes for tap locations 54, 56 and 58 (see FIG. 15).

Figure 19:
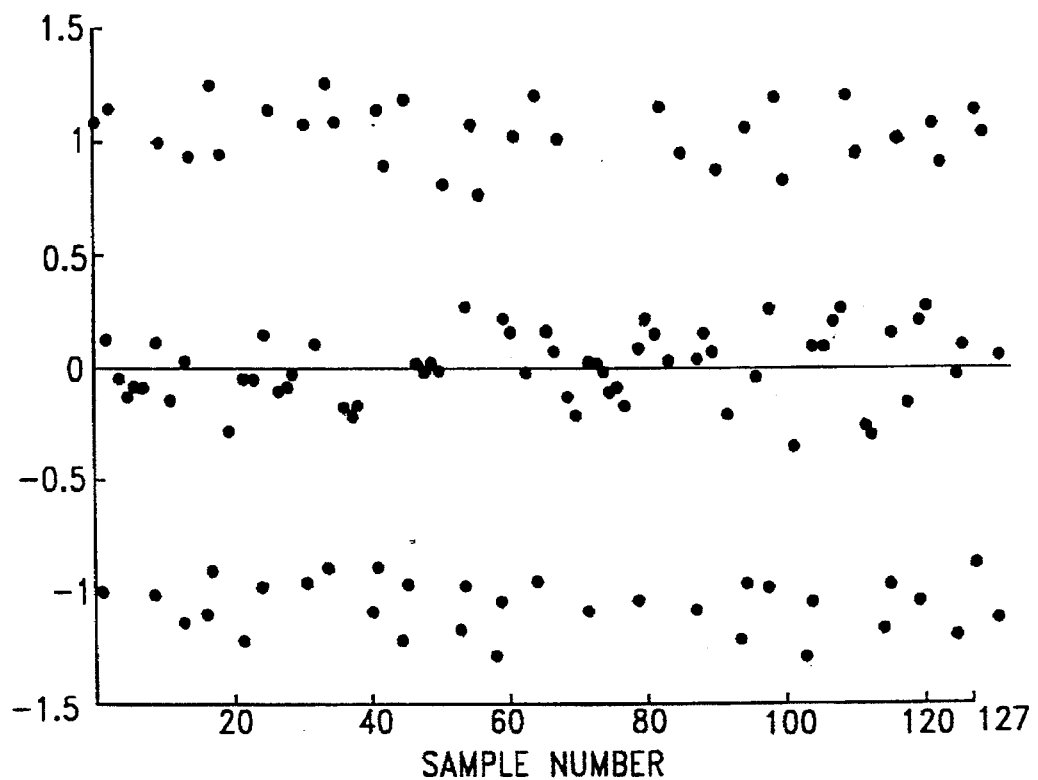
FIG. 19 provides a graphical representation of the bit-rate sample values obtained at the beginning of an adaptation operation, wherein initial tap weight values (with the exception of the main tap weight value) were purposely distorted from nominal tap weight values.

Referring now to FIGS. 19 and 20, shown therein are graphical representations of the readback sample values obtained by the sampler circuit 28 of FIG. 1 in response to the 127-bit binary input, periodic write sequence at the beginning and at the end of an adaptation operation, respectively. More particularly, FIG. 19 provides the bit-rate sample values obtained at the beginning of an adaptation operation, wherein the initial tap weights supplied by the DAC 150 of the adaptive tap weight control circuit 24 of FIG. 4 (with the exception of the main tap weight) were purposely distorted (by about plus or minus 35%) from the values provided in Table I. hereinabove. As will be recalled, the sample values in an ideal PR-4 channel are nominally −1, 0 and 1, and as shown by FIG. 19, the actual sample values obtained at the beginning of this simulated adaptation operation show large initial variations from these values. However, the adaptive tap weight control circuit 24 operates to iteratively solve for the proper tap weight coefficients (as shown in Table I.) so that, over time, the sample values nominally converge to about −1, 0 and 1, respectively, as shown in FIG. 20. In other words, FIG. 20 illustrates the sampling obtained as a result of the solution of the linear equations expressed by equation (6) hereinabove by the adaptive tap weight control circuit 24 (and the sample points shown in FIG. 20 correspond to values shown on the output signal curve 424 of FIG. 17).

It will be recognized that the time (adaptation cycles) required to achieve equalization by the adaptive tap weight control circuit 24 will depend upon the initial settings of the tap weights, and further will depend upon the construction of the adaptive tap weight control circuit 24 (as explained hereinabove, the analog embodiment of this circuit shown in FIG. 4 will achieve adaptation at a relatively faster rate than the alternative digital embodiment shown in FIG. 5). It will further be recognized that in the preferred embodiment, the adaptive tap weight control circuit 24 continuously operates to iterate to the appropriate tap weights as the read signal is provided to the transversal equalizer 16. Finally, as provided hereinabove it is contemplated that the adaptive tap weight control circuit 24 will have initial values of tap weight provided to the DAC 150 at each initialization of the circuit, and that these initial values could be set during the manufacturing process (so that the same values are provided each time the disc drive is initialized) or tap weight values calculated during operation could be stored and subsequently retrieved at the next initialization of the drive.

Figure 21:
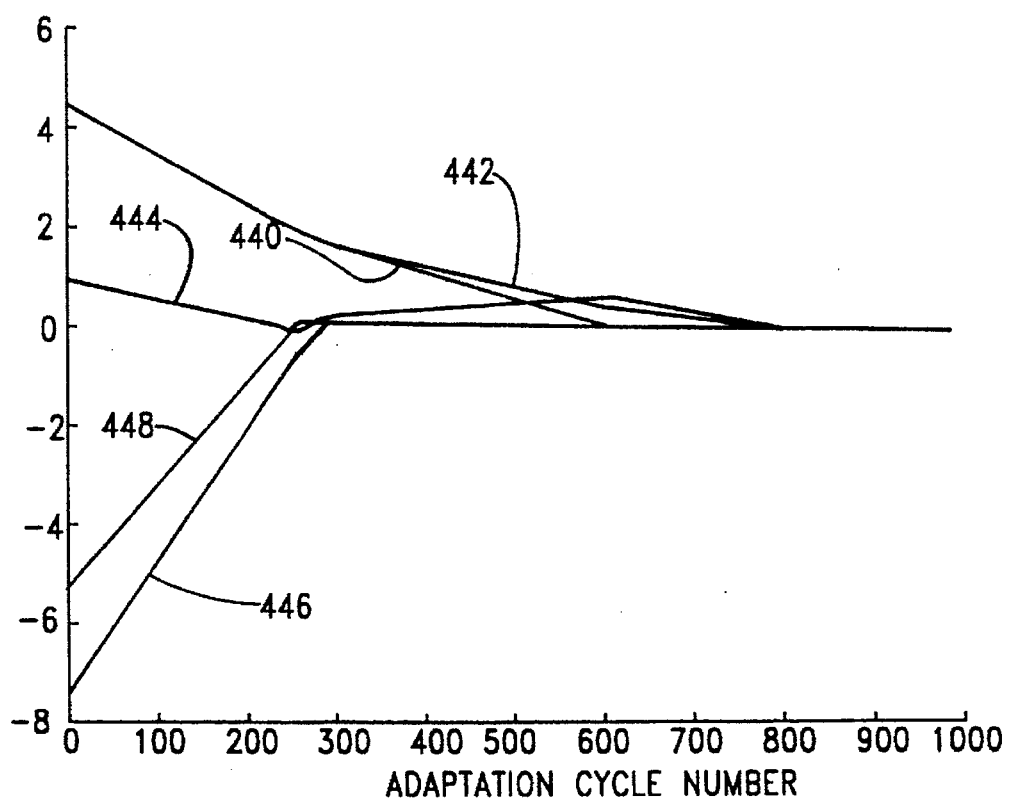
FIG. 21 provides a graphical representation of sampled values of crosscorrelations converging to zero during the adaptation operation.

Reference is now made back to the foregoing discussion regarding the crosscorrelations generated by the adaptive tap weight control circuit 24. With reference to FIG. 4, the multipliers 100, 102, 104, 106 and 108 shown therein multiply the received sampled tap signals by the estimated error signal "$Y_n - d_n$" from the error generator circuit 86 by way of the signal path 89, thus providing the sampled values of crosscorrelations on signal paths 110, 112, 114, 116 and 118. FIG. 21 provides a graphical representation of these sampled values of crosscorrelations converging to zero over time (i.e., elapsed adaptation clock cycles). More particularly, FIG. 21 provides convergence curves 440, 442, 444, 446 and 448 for the tap locations 50, 52, 54, 56 and 58, respectively, thereby illustrating the operation of the adaptive tap weight control circuit 24 during adaptation.

Having now concluded the discussion regarding the results of computer simulation with respect to FIGS. 13–21, additional considerations, including additional applications for the present invention, will now be addressed. As described hereinabove, the deviations (errors) relative to an ideal equalized waveform at the output of the transversal equalizer 16 of the present inventions have two components: shape errors due to imperfect equalization to the desired signal shape, and noise-generated errors due to the presence of output noise even after filtration is completed.

The shape errors due to imperfect equalization can generally be minimized by the aforedescribed LMS- type equalization. For example, as already mentioned the results of the simulation resulted in MSE shape errors on the order of about 32 dB below the useful signal. However, in general, there is no way to predict quantitatively values of MSE shape errors without considering all the concrete circumstances in which the filtering system 10 operates (including the input signal, properties of the channel, architecture and complexity of the filter, filter parameters, etc.). It will be recognized, though, that this is also true for filters in general communication channels of the previous art. As described in the previously incorporated Gitlin et al. reference (see pp. 528 and following), for equalizers of constrained-complexity, theoretical asymptotical estimates do not provide much insight as to dependance of the minimum MSE on the properties of the real channel and the real filter. The typical values of MSE at the output of real channel filters are usually discussed by way of examples and experiments.

The adaptive LMS equalization described above does result in minimal MSE shape errors, but these MSE errors will be different for different circumstances and different (programmed) parameters of the filter used. This will be clear from equation (3) above, where output Y depends on X's, X's being the filtered (inside the transversal equalizer 16) signals. To achieve acceptable performance, it may be necessary to simulate several versions of the filters with different parameters and of different complexities in order to iterate to an acceptable solution.

Additionally, it has been found to be generally impossible to predict quantitatively beforehand the effect of random noise at the system output. However, the noise caused error can be evaluated relatively easily after the desired filter transfer functions have been determined. More particularly, it is given by the known relationships between Gaussian noise at the input and the output of a linear system:

$$\sigma_{OUT}^2 = \Psi(0) = \frac{1}{2\pi} \int_0^\infty N_{IN}(\omega)|Mag(\omega)|^2 d\omega \qquad (13)$$

where $\sigma_{OUT}^2$ is the noise power at the output of a linear system or the MSE caused by the (filtered) random noise, $\Psi(\tau)$ is the autocorrelation function of output noise, $N_{IN}$ is the noise power spectrum at the input, and $Mag(\omega)$ is the magnitude response of the system. The total mean squared error (TMSE) at the output of the filtering system 10 is, therefore, the sum of two MSE errors: those in shape and caused by the (filtered) random noise; that is, $$TMSE = MSE_{SHAPE} + \sigma_{OUT}^2 \qquad (14)$$

It will be recognized that efforts should be made to reduce the TMSE error, not only the shape MSE error. From this viewpoint, the equalization achieved in the presented above simulation may not be optimal. Recall that the filter magnitude response obtained (see FIG. 18) was the result of efforts to match the theoretical PR-4 response (shown in FIG. 2b) and the band-pass filter delay section 44 provided a significant overlapping into band-reject area for the PR-4 signal. This caused an excessive boost of channel high frequencies components that were deficient in the original input signal. However, the weight of these components in the total theoretical PR-4 signal is small, so it might be better to use less boost, because, according to equation (13) (in conjunction with the shape of curve 428 in FIG. 18), the noise level at the output of the transversal equalizer 16 was significantly enhanced.

Generally, the best choice between utilization of possible time-domain and frequency-domain filtrations depends on the actual noise level at the inputs, as well as an intelligent compromise between the magnitudes of shape and noise errors at the output. As provided hereinabove, the filtering system 10 of the present invention generally provides sufficient latitude in making such design compromises.

As provided hereinabove, the present invention can have many different applications related to communication channels. First of all, the present invention can be useful in general communication channels for imitation of performance of FSE equalizers. With knowledge of the received bit-pulse, the use of cumulative filtering techniques (as described hereinabove) can result in the generation at the main tap of a double-domain transversal equalizer a reasonably good approximation of a matched filter in the frequency-domain. Additionally, the time-domain adaptive filtration operation of the equalizer will emulate the remaining functions of the FSE. Of course, the obtained approximation to an FSE will not be fully adaptive, because it will not have adaptivity in the frequency domain. However, in some applications this could still be found useful, due to simplicity, low cost, low power consumption and very high transfer rate capabilities.

Additionally, the disclosed filtering system 10 can be used in magnetic storage applications virtually without changes (except for changes in the target waveform shape) in all other types of partial response channels that are potentially more optimal for magnetic storage. Of course, other types of partial response channels would require more complex Viterbi decoders than the Viterbi decoder used in a conventional PR-4 channel. For additional discussion regarding other types of partial response channels, see H. K. Thapar and A. M. Patel, "A CLASS OF PARTIAL RESPONSE SYSTEMS FOR INCREASING STORAGE DENSITY IN MAGNETIC RECORDING", IEEE Transactions on Magnetics, vol. MAG-23, No. 5. September 1987, pp. 3666–3668.

Figure 22:
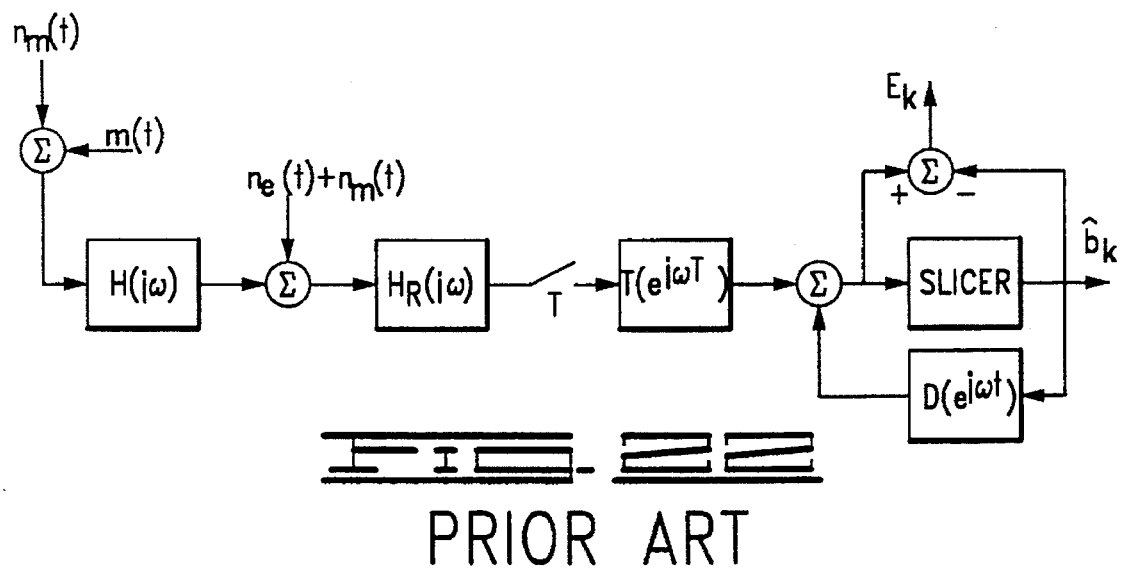
FIG. 22 provides a prior art functional block diagram of a magnetic recording channel with a Decision Feedback Equalization (DFE).

To outline other potential applications of the present invention, reference is made to K. Han and R. Spenser, "COMPARISON OF DIFFERENT DETECTION TECHNIQUES FOR DIGITAL MAGNETIC RECORDING CHANNELS", IEEE Transactions on Magnetics, vol. 31, No. 2, March 1995, pp. 1128–1133, incorporated herein by reference. As shown in this reference, FIG. 22 provides a prior art block diagram of a magnetic recording channel with a Decision Feedback Equalization (DFE). $T(e^{jwT})$ is the forward equalizer which will remove the pre-cursor ISI and $D(e^{jwT})$ is the feedback equalizer, strictly causal filter, which will remove all post-cursor ISI. An error signal $E_k$, is defined to be the difference between the input and the output of the slicer. An optimal design is to chose $T(e^{jwT})$ and $D(e^{jwT})$ so that the power of the error signal $E_k$ will be minimized.

The foregoing reference points out that the FIR (finite impulse response) filter (which in this context is synonymous to the synchronous equalizer of the previous art) is used in implementation of $T(e^{jwT})$ and $D(e^{jwT})$. As explained previously, the double-domain filters of the present invention have additional degrees of freedom in filtration and thus will do a much better job at less complexity and cost than synchronous equalizers of the previous art.

Figure 23:
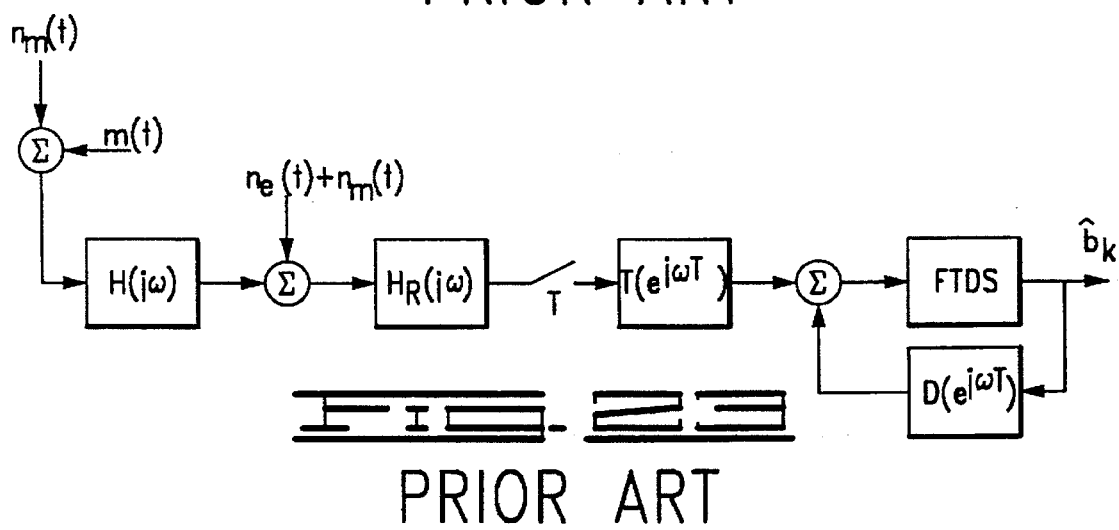
FIG. 23 provides a prior art block functional diagram for a magnetic recording channel with Fixed-Delay Tree Search with Decision Feedback (FDTS/DF).

Additionally, FIG. 23 provides another block diagram from the same reference and represents the block diagram of the magnetic recording channel with a Fixed-Delay Tree Search with Decision Feedback (FDTS/DF). The forward equalizer, $T(e^{jwT})$ equalizes the real channel to a certain target and the feedback equalizer, $D(e^{jwT})$, will cancel the "tail" of the target response. The FDTS decision unit, which is depth-limited exhaustive tree search algorithm, will see a truncated version of the target response. The optimization and implementation of $T(e^{jwT})$ and $D(e^{jwT})$ blocks is the same as in the DFE channel of FIG. 22.

Again, the double-domain filters of the present invention will do a much better job at less complexity and cost than synchronous equalizers of the previous art.

Figure 24:
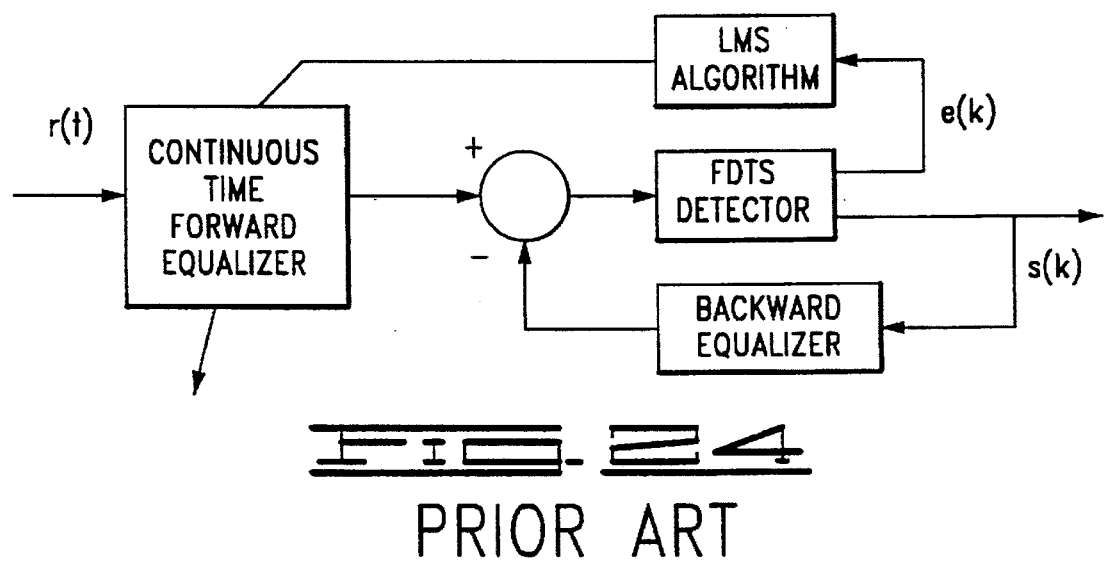
FIG. 24 provides an alternative prior art block diagram of a magnetic recording channel (FDTS/DF) to the block diagram shown in FIG. 23.

Referring now to FIG. 24, shown therein is a block diagram of the same type of magnetic recording channel (FDTS/DF) as that shown on FIG. 23, represented with a different viewpoint. Particularly, FIG. 24 is provided from K. C. Bracken, H. M. Zayed and L. R. Carley "ADAPTIVE CONTINUOUS TIME EQUALIZATION AND FDTS/DF SEQUENCE DETECTION", IEEE Transaction on Magnetics, vol. 31, No. 6, November 1995, pp. 3048–3050. For the same reasons of reducing power consumption and silicon die area, the digital FIR filters employed in the system shown on FIG. 23 are replaced in FIG. 24 by the continuous time filters. However, the adaptive (LMS algorithm) forward equalizer is the FREQUENCY-DOMAIN ONLY equalizer, and will have generally unacceptable performance in the time domain. However, replacing the frequency-domain forward equalizer of the system of FIG. 23 with the filtering system of the present invention will solve the stated problem, greatly enhance the performance of forward equalizer and will relieve the burden of the FDTS/DF block.

It will be clear that the present invention is well adapted to carry out the objects and attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. An analog adaptive frequency and time-domain filter for a sampled communication channel, the filter comprising:

a plurality of serially connected analog frequency-domain filter sections with associated tap locations, each filter section providing a uniform, one-bit delay and providing selected frequency-domain filtering in accordance with a filter section transfer function, the plurality of serially connected analog frequency-domain filter sections providing cumulative frequency domain filtering of an input signal;

adaptive tap weight generation means responsive to the tap locations for generating analog tap weight signals indicative of an optimal relative weighting of the signals present at the tap locations;

a plurality of analog multipliers having control inputs controlled by the adaptive tap weights controlling means, each analog multiplier connected to a selected tap location, whereby outputs of the analog multipliers are the products of the signals present at the tap locations and the tap weight signals;

analog summing means, responsive to the analog multipliers, for generating an output filtered signal indicative of the sum of the outputs of the analog multipliers;

a sampler circuit, responsive to the analog summing means, for sampling the output filtered signal to generate analog sampled values; and frequency response control means, connected to the analog filter sections, for providing a frequency response control signal indicative of the desired frequency response of the analog filter sections;

wherein the adaptive tap weight generation means generates the tap weight signals in response to the analog sampled values.

2. The filter of claim 1, wherein each filter section transfer function is characterized as a quotient having a linear-phase denominator and a real numerator, wherein the frequency response of each filter section is controlled by the numerator and the delay of each filter section is controlled by the denominator.

3. The filter of claim 2, wherein the denominator of each filter section transfer function is characterized as a fourth-order polynomial, and wherein the numerator of each filter section transfer function is characterized by the expression $K_2s^2+K_0a_0$, wherein $K_0$ and $K_2$ are coefficients and $a_o$ is the 0-th order term of the denominator polynomial, the magnitude of the coefficients $K_0$ and $K_2$ determined by the frequency response control signal provided by the frequency response control means.

4. The filter of claim 3, wherein at least one filter section has values of $K_0$ greater than zero and $K_2$ equal to zero, thereby operating as a low-pass filter.

5. The filter of claim 3, wherein at least one filter section has values of $K_0$ between zero and one and $K_2$ less than zero, thereby operating as a band-pass filter.

6. The filter of claim 3, wherein at least one filter section has values of $K_0$ equal to one and $K_2$ greater than zero, thereby operating as a low-pass-band-reject filter.

7. The filter of claim 3, wherein at least one filter section has values of $K_0$ equal to one and $K_2$ between zero and one, thereby operating as a low-pass-with-small-boost filter.

8. The filter of claim 1, wherein the adaptive tap weight generation means comprises:

a digital to analog converter for providing the analog tap weight signals, the digital to analog converter including registers for storing digital input values received by the adaptive tap weight generation means indicative of the analog tap weight signals;

a slicer-estimator circuit, responsive to the sampler circuit, for generating estimated sample values from the analog sampled values;

an error generator circuit, responsive to the slicer-estimator circuit and the sampler circuit, for outputting an estimated error signal indicative of the difference between the analog sample values and the estimated sample values;

a plurality of sample and hold circuits, each sample and hold circuit responsive to a corresponding tap location for sampling and holding an analog representation of the signal present at each tap location;

a plurality of multipliers, responsive to the sample and hold circuits and the error generation circuit, for multiplying the analog representations of the signal present at the tap locations by the estimated error signal to generate crosscorrelation signals;

a plurality of low-pass filters, responsive to the multipliers, for integrating the crosscorrelation signals to provide integrated crosscorrelation signals; and a threshold circuit, responsive to the plurality of low-pass filters, for modifying the input digital values in the registers of the digital to analog converter as the integrated crosscorrelation signals exceed predetermined thresholds.

9. The filter of claim 1, wherein each filter section comprises a transconductor, wherein the response of the transconductor is controlled by the frequency response control signal.

10. A filtering system for filtering an input signal in a sampled communication channel, the filtering system comprising:

delay control means for generating an analog time delay control signal;

frequency response control means for generating an analog frequency response control signal;

tap weight control means for generating analog tap weight control signals;

analog equalization means, responsive to the delay control means, the frequency response control means and the tap weight control means, for performing time and frequency domain filtering of the input signal, the analog equalization means including:

a plurality of serially connected analog filter sections having associated tap locations, each analog filter section having a selected frequency response determined by the frequency response control signal and a time-delay response determined by the time delay control signal;

multiplication means, responsive to the tap locations, for multiplying signals present at the tap locations by the analog tap weight control signals to generate a plurality of product signals; and summation means, responsive to the multiplication means, for summing the plurality of product signals to generate an output filtered signal;

sampling means, responsive to the analog equalization means, for sampling the output filtered signal and outputting discrete analog sample values; and timing means, responsive to the sampling means, for providing timing signals at a bit rate in response to the discrete analog sample values to the sampling means, the tap weight control means and the delay control means;

wherein the tap weight control means generates the analog tap weight signals in response to the signals present at the tap locations, the timing signals from the timing means and the discrete analog sample values from the sampling means.

11. The filtering system of claim 10, wherein the tap weight control means comprises:

a digital to analog converter for providing the analog tap weight signals, the digital to analog converter including registers for storing digital input values received by the tap weight control means indicative of the analog tap weight signals;

a slicer-estimator circuit, responsive to the sampling means, for generating estimated sample values from the discrete analog sampled values;

an error generator circuit, responsive to the slicer-estimator circuit and the sampling means, for outputting an estimated error signal indicative of the difference between the discrete analog sample values and the estimated sample values;

a plurality of sample and hold circuits, each sample and hold circuit responsive to a corresponding tap location for sampling and holding an analog representation of the signal present at each tap location;

a plurality of multipliers, responsive to the sample and hold circuits and the error generation circuit, for multiplying the analog representations of the signal present at the tap locations by the estimated error signal to generate crosscorrelation signals;

a plurality of low-pass filters, responsive to the multipliers, for integrating the crosscorrelation signals to provide integrated crosscorrelation signals; and a threshold circuit, responsive to the plurality of low-pass filters, for modifying the input digital values in the registers of the digital to analog converter as the integrated crosscorrelation signals exceed predetermined thresholds.

12. The filter of claim 10, wherein the delay control means comprises:

a first divider circuit outputting a first divided clock signal in response to the timing signals from the timing means;

a second divider circuit, synchronized by the first divider circuit and responsive to the timing means, outputting a second divided clock signal in response to the timing signals from the timing means, wherein the second divided clock signal is out of phase with the first divided clock signal by a selected amount;

a master delay circuit, responsive to the first divider circuit, for providing a selected amount of delay to the first clock signal to generate a delayed clock signal;

a phase detector, responsive to the master delay circuit and to the second divider circuit, for outputting an error signal indicative of the phase difference between the second clock signal and the delayed clock signal;

a low pass filter-integrator, responsive to the phase detector, for integrating the error signal to provide an integrated error signal;

initial delay means for providing an initial delay value indicative of the nominal amount of master delay;

a summer circuit, responsive to the initial delay means and the low pass filter-integrator, for summing the initial delay value and the integrated error signal to generate a bias signal, wherein the bias signal comprises a feedback signal provided to the master delay circuit to adaptively adjust the amount of delay provided by the master delay circuit, and wherein the bias signal further comprises the analog time delay control signal used to control the time-delay response of the filter sections.

13. The filter of claim 12, wherein each filter section comprises a transconductor, wherein the response of the transconductor is controlled by the analog time delay control signal.

14. In a disc drive of the type having a disc and a read/write transducer head for magnetically writing and subsequently reading data from the disc, the disc drive including a communication channel for receiving and processing an input signal indicative of the data read from the head, an improved communication channel filtering system comprising:

a double-domain transversal equalizer, responsive to the input signal, comprising a plurality of serially connected analog filter sections having associated tap locations, each analog filter section comprising a programmable frequency and time domain filter for providing sequential frequency domain filtering and time delay in accordance with a controllable transfer function, the double-domain transversal equalizer further comprising a plurality of analog multipliers, responsive to the tap locations, for multiplying signals present at the tap locations by analog tap weight signals to generate a plurality of product signals, and summation means, responsive to the multiplication means, for summing the plurality of product signals to generate an output filtered signal;

a sampler circuit, responsive to the double-domain transversal equalizer, for sampling the output filtered signal to generate output filtered sample values;

adaptive tap weight generation means, responsive to the double-domain, analog transversal equalizer and the sampler circuit, for generating the analog tap weight signals in response to the signals present at the tap locations and the output filtered sample values;

a delay control circuit, connected to the analog filter sections, for generating a delay signal to control the time delay of each analog filter section; and frequency response control means, connected to the analog filter sections, for generating a frequency response control signal to control the frequency response of each analog filter section.

15. The improved communication channel filtering system of claim 14, wherein the controllable transfer function of each filter section is characterized as having a linear-phase denominator and a real numerator, wherein the frequency response of each filter section is controlled by the numerator and the delay of each filter section is controlled by the denominator.

16. The improved communication channel filtering system of claim 15, wherein the denominator is characterized as a fourth-order polynomial, and wherein the numerator of each filter section transfer function is characterized by the expression $K_2 s^2 + K_0 a_o$, wherein $K_0$ and $K_2$ are coefficients, the magnitude of the coefficients $K_0$ and $K_2$ determined by the frequency response control signal provided by the frequency response control means.

17. The improved communication channel filtering system of claim 16, wherein at least one filter section receives values of $K_0$ greater than zero and $K_2$ equal to zero, thereby operating as a low-pass filter.

18. The improved communication channel filtering system of claim 16, wherein at least one filter section receives values of $K_0$ between zero and one and $K_2$ less than zero, thereby operating as a band-pass filter.

19. The improved communication channel filtering system of claim 16, wherein at least one filter section receives values of $K_0$ equal to one and $K_2$ greater than zero, thereby operating as a low-pass-band-reject filter.

20. The improved communication channel filtering system of claim 16, wherein at least one filter section receives values of $K_0$ equal to one and $K_2$ between zero and one, thereby operating as a low-pass-with-small-boost filter.

21. The improved communication channel filtering system of claim 14, wherein the adaptive tap weight generation means comprises:

a digital to analog converter including registers for storing digital input values indicative of the analog tap weight signals;

a slicer-estimator circuit, responsive to the sampler circuit, for generating estimated sample values from the output filtered sample values;

an error generator circuit, responsive to the slicer-estimator circuit and the sampler circuit, for outputting an estimated error signal indicative of the difference between the output filtered sample values and the estimated sample values;

a plurality of sample and hold circuits, each sample and hold circuit responsive to a corresponding tap location for sampling and holding an analog representation of the signal present at each tap location;

a plurality of multipliers, responsive to the sample and hold circuits and the error generation circuit, for multiplying the analog representations of the signal present at the tap locations by the estimated error signal to generate crosscorrelation signals;

a plurality of low-pass filters, responsive to the multipliers, for integrating the crosscorrelation signals to provide integrated crosscorrelation signals; and a threshold circuit, responsive to the plurality of low-pass filters, for modifying the input digital values in the registers of the digital to analog converter as the integrated crosscorrelation signals exceed predetermined thresholds.

22. The filter of claim 14, wherein the delay control circuit comprises:

a first divider circuit outputting a first divided clock signal in response to an input clock signal;

a second divider circuit, synchronized by the first divider circuit and responsive to the input clock signal, outputting a second divided clock signal, wherein the second divided clock signal is out of phase with the first divided clock signal by a selected amount;

a master delay circuit, responsive to the first divider circuit, for providing a selected amount of delay to the first clock signal to generate a delayed clock signal;

a phase detector, responsive to the master delay circuit and to the second divider circuit, for outputting an error signal indicative of the phase difference between the second clock signal and the delayed clock signal;

a low pass filter-integrator, responsive to the phase detector, for integrating the error signal to provide an integrated error signal;

initial delay means for providing an initial delay value indicative of the nominal amount of master delay;

a summer circuit, responsive to the initial delay means and the low pass filter-integrator, for summing the initial delay value and the integrated error signal to generate a bias signal, wherein the bias signal comprises a feedback signal provided to the master delay circuit to adaptively adjust the amount of delay provided by the master delay circuit, and wherein the bias signal further comprises the delay signal used to control the time delay of each filter sections.

23. The filter of claim 22, wherein each filter section comprises a transconductor, wherein the response of the transconductor is controlled by the delay signal.

* * * * *

UNITED STATES PATENT AND TRADEMARK OFFICE
CERTIFICATE OF CORRECTION

PATENT NO. : 5,650,954
DATED : July 22, 1997
INVENTOR(S) : Vadim Boris Minuhin

It is certified that error appears in the above-indentified patent and that said Letters Patent is hereby corrected as shown below:

Column 1, line 27, please delete the word "input" and insert the word -- impulse--.

Column 7, lines 16, 17, 18 and 19, please delete the words "application Ser. No. 08/309,912 entitled DISC DRIVE PRML CHANNEL WITH ADAPTIVE ANALOG TRANSVERSAL EQUALIZER, filed Sep. 21, 1994 by" and after the words U. S. patent insert the words --No. 5,592,340 entitled COMMUNICATION CHANNEL WITH ADAPTIVE ANALOG TRANSVERSAL EQUALIZER, issued January 7, 1997 to--.

Column 8, line 10, please delete the word "IMPROVED".

Column 8, lines 30 and 31, delete the formula and substitute therefore:

$$y = \frac{\sin(\pi t/T)}{(\pi t/T)} - \frac{\sin[(\pi/T)(t-2T)]}{(\pi/T)(t-2T)}$$

Column 8, lines 32 and 33, please delete the words "k represents sequentially incremented integer values and".

Column 8, line 58, please make the first letter of the word 'with' lowercased.

Column 10, line 19, please delete "5,459,759" and insert --5,459,757--.

UNITED STATES PATENT AND TRADEMARK OFFICE
CERTIFICATE OF CORRECTION

PATENT NO.    : 5,650,954
DATED         : July 22, 1997
INVENTOR(S)   : Vadim Boris Minuhin It is certified that error appears in the above-indentified patent and that said Letters Patent is hereby corrected as shown below:

Column 11, line 15, please insert between the words 'can' and 'verified' the word --be--.

Column 16, line 35, please delete "and $g_{m4}$" and insert -- , $g_{m4}$ and $g_{m5}$--.

Column 16, lines 48 and 49, delete the formula and substitute therefore::

$$V_o = \frac{s^2 C_1 C_2 V_c + g_{m2} g_{m5} V_A}{s^2 C_1 C_2 + s C_1 g_{m3} + g_{m1} g_{m2}}$$

Signed and Sealed this

Twenty-eighth Day of April, 1998

*Attest:*

BRUCE LEHMAN

*Attesting Officer*          *Commissioner of Patents and Trademarks*